(12) United States Patent
Shinozaki

(10) Patent No.: US 6,288,928 B1
(45) Date of Patent: Sep. 11, 2001

(54) SEMICONDUCTOR INTEGRATED CIRCUIT AND METHOD OF CONTROLLING COLUMN SWITCH OF SEMICONDUCTOR INTEGRATED CIRCUIT IN WRITE OPERATION

(75) Inventor: Naoharu Shinozaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/588,230

(22) Filed: Jun. 6, 2000

(30) Foreign Application Priority Data

Sep. 27, 1999 (JP) .................................................. 11-271930

(51) Int. Cl.[7] ...................................................... G11C 5/06
(52) U.S. Cl. ............................ 365/63; 365/205; 365/190; 365/203
(58) Field of Search ............................. 365/63, 205, 190, 365/207, 51, 189.01, 203

(56) References Cited

U.S. PATENT DOCUMENTS 5,648,928 * 7/1997 Yoon et al. ............................ 365/63
6,026,034 * 2/2000 Suzuki et al. ....................... 365/190
6,154,404 * 11/2000 Hwang ................................. 365/205

FOREIGN PATENT DOCUMENTS 2-226581    9/1990   (JP) .

* cited by examiner

*Primary Examiner*—David Nelms
*Assistant Examiner*—David Lam
(74) *Attorney, Agent, or Firm*—Arent Fox Kintner Plotkin & Kahn, PLLC

(57) ABSTRACT

A semiconductor integrated circuit comprising a memory cell, a column switch for transmitting data to a bit line, a sense amplifier for amplifying data, a precharging circuit for charging the bit line, and a control unit. The control unit controls the transfer switch in the memory cell, the column switch, the sense amplifier, and the precharging circuit so as to differentiate the control timings of these circuits between a write operation and a read operation. For example, the column switch is turned on after the transfer switch is turned on and before the amplification of the sense amplifier is started in a write operation. Here, the data retained in the memory cell are rewritten into write data before amplified by the sense amplifier. This minimizes the data inversion time and heightens the speed of write operations. The power consumption can be reduced since the circuits optimally operate in accordance with the operating modes.

15 Claims, 20 Drawing Sheets

SEMICONDUCTOR INTEGRATED CIRCUIT AND METHOD OF CONTROLLING COLUMN SWITCH OF SEMICONDUCTOR INTEGRATED CIRCUIT IN WRITE OPERATION

BACKGROUND OF THE INVENTION

1. Field of the Invention

The present invention relates to a semiconductor integrated circuit having memory cells, and more particularly to a technology for performing write operations at high speed.

2. Description of the Related Art

FIG. 1 shows the configuration of the main parts in a semiconductor integrated circuit of this type. In the drawings, those signal lines shown by thick lines are composed of a plurality of lines each. Some of the blocks connected with the thick lines are composed of a plurality of circuits.

The semiconductor integrated circuit comprises an input/output control unit 1, a core control unit 2, and a memory core 3.

The input/output control unit 1 comprises a clock buffer 4, a command buffer 5, a row address buffer 6, a column address buffer 7, an input/output buffer 8, and a command decoder 9.

The clock buffer 4 receives a clock signal CLK, and outputs an internal clock signal ICLK. The command buffer 5 accepts a command signal CMD in synchronization with the internal clock signal ICLK, and outputs the accepted signal as an internal command signal ICMD.

The row address buffer 6 accepts a row address signal RAD in synchronization with the internal clock signal ICLK, and outputs the accepted signal as an internal row address signal IRAD. The column address buffer 7 accepts a column address signal CAD in synchronization with the internal clock signal ICLK, and outputs the accepted signal as an internal column address signal ICAD.

The input/output buffer 8, in a write operation, accepts a data signal DQ in synchronization with the internal clock signal ICLK, and outputs the same in the form of an internal data signal IDQ. In a read operation, the input/output buffer 8 accepts an internal data signal IDQ in synchronization with the internal clock signal ICLK, and outputs the accepted signal as a data signal DQ.

The command decoder 9 receives the internal clock signal ICLK and the internal command signal ICMD, decodes the command, and generates control signals RDZ, WRZ, and the like for controlling the main circuits of the semiconductor integrated circuit. Here, the control signal RDZ is generated when a command signal CMD corresponding to a read operation is supplied. The control signal WRZ is generated when a command signal CMD corresponding to a write operation is supplied.

The core control unit 2 comprises an RAS generator 10, a precharge generator 11, a control circuit 12, a predecoder 13, a block decoder 14, a CAS generator 15, a control circuit 16, a predecoder 17, a word decoder 18, a BRSZ generator 19, a sense amplifier generator 20, a column decoder 21, a read control circuit 22, a write control circuit 23, a read buffer 24, and a write buffer 25. Of the circuits mentioned above, the RAS generator 10, control circuit 12, word decoder 18, BRSZ generator 19, sense amplifier generator 20, and column decoder 21 function as a timing control unit 26.

The RAS generator 10 receives the control signals RDZ and WRZ, and the precharging signal PREZ from the precharge generator 11, and outputs a row controlling signal RASZ. The precharge generator 11 receives the row controlling signal RASZ, and outputs the precharging signal PREZ after a predetermined time.

The control circuit 12 receives the row controlling signal RASZ, generates a plurality of control signals RCON, and outputs the respective control signals RCON to the word decoder 18, the BRSZ generator 19, and the sense amplifier generator 20.

The predecoder 13 receives the internal row address signal IRAD, and outputs a predecode signal RPDEC. The block decoder 14 receives part of the predecode signal RPDEC, generates a decode signal, and outputs this decode signal to the word decoder 18, the BRSZ generator 19, and the sense amplifier generator 20.

The CAS generator 15 receives the control signals RDZ and WRZ, and outputs a column controlling signal CASZ. The control circuit 16 receives the column controlling signal CASZ, generates a plurality of control signals CCON, and outputs the respective control signals CCON to the column decoder 21, the read control circuit 22, and the write control circuit 23.

The predecoder 17 receives the internal column address signal ICAD, and outputs a predecode signal CPDEC.

The read control circuit 22 receives the predecode signal CPDEC and the control signal CCON, and outputs a read data controlling signal RD. The write control circuit 23 receives the predecode signal CPDEC and the control signal CCON, and outputs a write data controlling signal WD.

The read buffer 24 receives the common date signals DBZ and DBX from the memory core 3 in synchronization with the read data controlling signal RD, and outputs the same in the form of the internal data signal IDQ. The write buffer 25 receives the internal data signal IDQ in synchronization with the write data controlling signal WD, and outputs the same to the memory core 3 in the form of the common data signals DBZ and DBX. Here, the common data signals DBZ and DBX are complementary signals.

The word decoder 18 receives a predetermined control signal RCON, the predecode signals RPDEC and CPDEC, and the decode signal from the block decoder 14, generates a word line signal WLZ, and outputs the generated signal to the memory core 3.

The BRSZ generator 19 receives a predetermined control signal RCON, the predecode signals RPDEC and CPDEC, and the decode signal from the block decoder 14, generates a bit line controlling signal BRSZ, and outputs the generated signal to the memory core 3.

The sense amplifier generator 20 receives a predetermined control signal RCON, the predecode signals RPDEC and CPDEC, and the decode signal from the block decoder 14, generates a sense amplifier activating signal LEZ, and outputs the generated signal to the memory core 3.

The column decoder 21 receives the control signal CCON and the predecode signal CPDEC, generates a column selecting signal CLZ, and outputs the generated signal to the memory core 3.

The memory core 3 comprises a plurality of memory cells MC which are connected to word lines WL and bit lines BL (/BL) arranged vertically and horizontally. This example uses a DRAM memory core 3.

FIG. 2 shows the main parts of the memory core 3.

The memory core 3 comprises column switches 3a and 3b consisting of an nMOS, a sense amplifier 27, an nMOS 3c for equalization, nMOSs 3d and 3e for precharge, and a memory cell MS, which are connected to complementary bit lines BL and /BL.

Either the sources or the drains of the column switches 3a and 3b are connected to the bit lines BL and /BL, respectively. The others are connected to the common data signals DBZ and DBX, respectively. The gates of the column switches 3a and 3b receive the column selecting signal CLZ.

The sense amplifier 27 comprises: a CMOS inverter consisting of a pMOS 27a and an nMOS 27b; a CMOS inverter consisting of a PMOS 27c and an nMOS 27d; and a pMOS 27e and nMOS 27f for supplying a driving voltage to the sources of the respective CMOS inverters. The inputs and outputs of the CMOS inverters are connected with each other, and the outputs are connected to the bit lines BL and /BL separately. The pMOS 27e has the drain connected to the sources of the pMOS 27a and pMOS 27c, and the source connected to a power supply line VDD. The gate of the PMOS 27e is supplied with the sense amplifier activating signal LEZ through an inverter 27g. The nMOS 27f has its drain connected to the nMOS 27b and nMOS 27d, and the source connected to a ground line VSS. The gate of the nMOS 27f is supplied with the sense amplifier activating signal LEZ.

The source and the drain of the nMOS 3c are connected to the bit lines BL and /BL, respectively. Either the sources or the drains of the nMOSs 3d and 3e are connected to the bit lines BL and /BL, respectively. The others are connected to a precharging line VPR. The gates of the nMOSs 3c, 3d, and 3e receive the bit line controlling signal BRSZ.

The memory cell MS consists of an nMOS 28a for data transmission and a capacitor 28b. The gate of the nMOS 28a receives the word line signal WLZ.

FIG. 3 shows the main parts of the timing control unit 26.

The timing control unit 26 receives the precharging signal PREZ and the control signals RDZ and WRZ, and generates the bit line controlling signal BRSZ, the word line signal WLZ, the sense amplifier activating signal LEZ, and the column selecting signal CLZ with predetermined timings.

The timing control unit 26 comprises a delay circuit 26a consisting of eight inverters connected in cascade, a delay circuit 26b consisting of 11 inverters connected in cascade, a two-input NAND gate 26c, an inverter 26d, a two-input NOR circuit 26e, a delay circuit 26f consisting of four inverters connected in cascade, a two-input OR circuit 26g, and a CLZ generating circuit 26h.

The CLZ generating circuit 26h consists of a two-input NAND gate, three inverters, and a two-input NOR gate connected in cascade. The CLZ generating circuit 26h generates a High pulse (the column selecting signal CLZ) in accordance with the delay time of its inverters a predetermined time after the rising edges of the received signals.

The delay circuit 26a receives the precharging signal PREZ, and outputs the signal delayed to the delay circuit 26b and the NOR circuit 26e.

The OR circuit 26g receives the control signals RDZ and WRZ, and outputs the received signals as an enable signal ENZ.

The NAND gate 26c receives the enable signal ENZ and the output of the delay circuit 26b, and outputs the bit line controlling signal BRSZ.

The NOR circuit 26e receives the output signal of the delay circuit 26a and, through the inverter 26d, the inverted signal of the enable signal ENZ, and outputs the word line signal WLZ.

The delay circuit 26f receives the word line signal WLZ, and outputs the sense amplifier activating signal LEZ.

The CLZ generating circuit 26h receives the enable signal ENZ and the sense amplifier activating signal LEZ, and outputs the column selecting signal CLZ.

FIG. 4 shows the timings of the main signals in a write operation.

Initially, the semiconductor integrated circuit accepts a write command (WCMD) and the data signal DQ, along with the row address signal RAD and column address signal CAD whose waveforms are not shown, in synchronization with the rise of the clock signal CLK. The command decoder 9 shown in FIG. 1 receives the write command, and outputs the control signal WRZ (FIG. 4(a)). The input/output buffer 8 outputs the accepted data signal DQ as the internal data signal IDQ (FIG. 4(b)).

The precharge generator 11 shown in FIG. 1 receives the row controlling signal RASZ output from the RAS generator 10, and turns the precharging signal PREZ to high level after a predetermined time (FIG. 4(c)).

The NAND gate 26c in the timing control unit 26 shown in FIG. 3 receives the high level of the control signal WRZ, and turns the bit line controlling signal BRSZ to low level (FIG. 4(d)).

Likewise, the NOR circuit 26e receives the high level of the control signal WRZ, and turns the word line signal WL to high level (FIG. 4(e)). Here, by a boosting circuit not shown, the word line signal WL is set to have a voltage higher than that of other high-level signals. Besides, the word lines WL in the memory core 3 shown in FIG. 1 have greater wiring lengths so that their wiring resistance and load capacitance are large. Therefore, the word line signal WLZ makes gentler shifts as compared to the other signals.

The memory cell MC shown in FIG. 2 receives the high level of the word line signal WLZ, and turns the nMOS 28a on. The data (storage charge) retained in the memory cell MC are shared in accordance with the capacitance ratio between this memory cell MC and the bit line BL (or /BL). Thus, the bit line BL (or /BL) varies in voltage (FIG. 4(f)).

Then, the delay circuit 26f shown in FIG. 3 receives the word line signal WLZ, and turns the sense amplifier activating signal LEZ to high level (FIG. 4(g)). The sense amplifier 27 shown in FIG. 2 is activated under the high level of the sense amplifier activating signal LEZ, so that the weak potential difference between the bit lines BL and /BL is amplified (FIG. 4(h)). That is, the data retained in the memory cell MC are amplified before execution of a write operation.

Then, the CLZ generating circuit 26h shown in FIG. 3 receives the high level of the sense amplifier activating signal LEZ, and sets the column selecting signal CLZ to high level for a predetermined period (FIG. 4(i)). The column switches 3a and 3b shown in FIG. 2 are turned on under the high level of the column selecting signal CLZ, so that the common data signals DBZ and DBX, or the write data, are transmitted to the bit lines BL and /BL, respectively (FIG. 4(j)). Here, when the data output from the memory cell MC and the common data signals DBZ and DBX are inverse in logic, a signal inverting operation is performed. Then, the common data signals DBZ and DBX or the write data are written to the memory cell MC.

Subsequently, the NOR circuit 26e shown in FIG. 3 receives the precharging signal PREZ transmitted through the delay circuit 26a, and turns the word line signal WLZ to low level (FIG. 4(k)). The low level of the word line signal WLZ turns off the nMOS 28a in the memory cell MC to finish writing data.

The delay circuit 26f receives the word line signal WLZ, and turns the sense amplifier activating signal LEZ to low level (FIG. 4(*l*)). The sense amplifier 27 shown in FIG. 2 is inactivated under the low level of the sense amplifier activating signal LEZ, whereby the amplifying operation to the common data signals DBZ and DBX transmitted to the bit lines BL and /BL is completed.

Then, the NAND gate 26c shown in FIG. 3 receives the inverted signal of the precharging signal PREZ transmitted through the delay circuits 26a and 26b, and turns the bit line controlling signal BRSZ to high level (FIG. 4 (*m*)). The nMOSs 3c, 3d, and 3e shown in FIG. 2 are turned on under the high level of the bit line controlling signal BRSZ. The bit lines BL and /BL are connected to the precharging line VPR, and equalized at the same time. Then, the bit lines BL and /BL are precharged to complete the write operation (FIG. 4(*n*)).

In the write operation of this example, the cycle time tRC, which is a period from the falling edge of the bit line controlling signal BRSZ to the precharge of the bit lines BL and /BL, is 40 ns.

FIG. 5 shows the timings of the main signals in a read operation.

Initially, the semiconductor integrated circuit accepts a read command (RCMD) along with the row address signal RAD and column address signal CAD whose waveforms are not shown, in synchronization with the rising edge of the clock signal CLK. The command decoder 9 shown in FIG. 1 receives the read command, and outputs the control signal RDZ (FIG. 5(*a*)).

The precharge generator 11 receives the row controlling signal RASZ output from the RAS generator 10, and turns the precharging signal PREZ to high level after a predetermined time (FIG. 5(*b*)).

The control signal RDZ is output at the same timing as that of the control signal WRZ in the write operation described above. Due to this, the circuits in the timing control unit 26 shown in FIG. 3 make the same operations as those in the write operation. Therefore, the bit line controlling signal BRSZ, the word line signal WLZ, the sense amplifier activating signal LEZ, and the column selecting signal CLZ show the same waveforms as those in the write operation (FIG. 4).

The memory cell MC shown in FIG. 2 receives the high level of the word line signal WLZ, and turns the nMOS 28a on. The data retained in the memory cell MC are output to the bit line BL (or /BL) as a weak signal (FIG. 5(*c*)).

The sense amplifier 27 is activated under the high level of the sense amplifier activating signal LEZ, thereby amplifying the level of the weak signal on the bit lines BL and /BL (FIG. 5(*d*)).

The column switches 3a and 3b are turned on under the high level of the column selecting signal CLZ, so that the signal on the bit lines BL and /BL is output as the common data signals DBZ and DBX.

The input/output buffer 8 shown in FIG. 1 outputs the common data signals DBZ and DBX (the internal data signal IDQ) output from the read buffer 24, to the chip exterior as the data signal DQ (FIG. 5(*e*)). Then, the read operation is completed.

In the read operation of this example, the cycle time tRC, or the period from the falling edge of the bit line controlling signal BRSZ to the precharge of the bit lines BL and /BL, is 40 ns. In fact, a read operation can be made faster than a write operation. The cycle time tRC for a read operation is, however, made identical to the cycle time tRC for a write operation with the ease of use for users considered.

By the way, a conventional semiconductor integrated circuit, in write operations, amplifies the data output from memory cells MC before supplying write data to bit lines BL and /BL. This requires the inverting operations to the data irrelevant to the write data in the write operations, causing a problem of extended write time.

In addition, the write cycle time and the read cycle time, being the operating specifications, are made identical with each other for the sake of higher usability. Therefore, when the write cycle time is extended in accordance with the possible write time, the read cycle time needs to be extended as well. That is, a longer write time requires increases in the cycle times including that of a read operation. This means needless circuit operations, thereby increasing the power consumption.

Japanese Patent Laid-Open Publication No. Hei 2-226581 discloses an example of inputting write data before the sense amplifier completes the amplifying operation (that is, in the amplifying operation). In this example, the write data are input after the sense amplifier operates to start amplifying the previous data in the memory cell. This entails the inverting operation to the previous data amplified. The operating timings of the internal circuits in the semiconductor integrated circuit vary with temperature and voltage. Therefore, in the cases where the write data are input in the amplifying operations of the sense amplifier, the write operations are not shortened enough and the power consumption is sufficiently reduced in the worst conditions.

SUMMARY OF THE INVENTION

An object of the present invention is to reduce the time necessary for writing data to memory cells.

Another object of the present invention is to reduce the time necessary for writing data to memory cells without increasing the power consumption.

According to one of the aspects of a semiconductor integrated circuit in the present invention, the semiconductor integrated circuit comprises a memory cell including a memory element and a transfer switch for connecting the memory element with a bit line, a column switch, a sense amplifier, and a control unit. The transfer switch connects the memory element with the bit line. The column switch transmits data to the bit line. The sense amplifier amplifies data transmitted to the bit line. The control unit controls the transfer switch, the column switch, and the sense amplifier. In a write operation, the column switch is turned on after the transfer switch is turned on and before the amplification of the sense amplifier is started.

In this semiconductor integrated circuit, the transfer switch is initially turned on so that the retained data irrelevant to write data are output from the memory cell to the bit line. Next, the column switch is turned on to transmit the write data to the bit line. Then, the retained data are rewritten into the write data before amplified by the sense amplifier. Subsequently, the sense amplifier initiates its amplification. When the retained data and the write data are inverse in logic, the data on the bit line need to be inverted. The data inversion time is, however, minimized since the retained data are rewritten into the write data before amplified by the sense amplifier. This heightens the speed of write operations.

According to another aspect of the semiconductor integrated circuit in the present invention, the semiconductor integrated circuit comprises a memory cell including a memory element and a transfer switch for connecting the memory element with a bit line, a column switch, a sense amplifier, and a control unit. The transfer switch connects the memory element with the bit line. The column switch transmits data to the bit line. The sense amplifier amplifies data transmitted to the bit line. The control unit controls the transfer switch, the column switch, and the sense amplifier. In a write operation, the column switch is turned on before the transfer switch is turned on.

In this semiconductor integrated circuit, the column switch is initially turned on to transmit write data to the bit line. At this moment, the retained data in the memory cell are not transmitted to the bit line because the transfer switch is off. Accordingly, the level of the bit line immediately turns to that of the write data. Then, the write data are written to the memory cell simultaneously with the turning-on of the transfer switch. This further heightens the speed of write operations.

According to another aspect of the semiconductor integrated circuit in the present invention, the start timings of the amplification of the sense amplifier are respectively optimized in a write operation and a read operation. As a result, this eliminates the unnecessary amplification period of the sense amplifier, thereby reducing the power consumption.

According to another aspect of the semiconductor integrated circuit in the present invention, the semiconductor integrated circuit further comprises a precharging circuit for charging the bit line. The control unit differentiates the timings the activation starts in the precharging circuit, between a read operation and a write operation. Therefore, the precharging operations in a read operation and a write operation are respectively performed at the optimum timings. As a result, the power consumption is reduced. Moreover, the timings of the read and the write controls can be respectively optimized to perform both the read and the write operations at high speed.

According to another aspect of the semiconductor integrated circuit in the present invention, the start timing of the precharging operation is variable in accordance with the product specifications and the variations in the manufacturing processes. The cycle times of each operation depend on the start timing of the precharging operation. Therefore, the cycle times can be optimally set in accordance with the capability of the product.

According to another aspect of the semiconductor integrated circuit in the present invention, the start timing of the precharging operation is optimized by blowing an implemented fuse in accordance with the operating characteristics evaluated by probing tests made in a wafer state.

According to another aspect of the semiconductor integrated circuit in the present invention, the start timing of the precharging operation is optimized to meet the product specifications, for example, by changing a photomask in accordance with the product specifications.

According to another aspect of the semiconductor integrated circuit in the present invention, the start timing of the precharging operation is optimized, for example, by changing the destinations of bonding wires connected with bonding pads in the assembly process.

According to another aspect of the semiconductor integrated circuit in the present invention, the semiconductor integrated circuit comprises a memory cell including a memory element and a transfer switch for connecting the memory element with a bit line, a column switch, a sense amplifier, and a control unit. The transfer switch connects the memory element with the bit line. The column switch transmits data to the bit line. The sense amplifier amplifies data transmitted to the bit line. The control unit controls the transfer switch, the column switch, and the sense amplifier.

In a write operation, the control unit makes no control of the amplification of the sense amplifier. The data transmitted to the bit line through the column switch is directly written to the memory cell. Since the sense amplifier is disabled in write operations, the power consumption is reduced. Besides, the retained data in the memory cell is not amplified on the bit line. This heightens the speed of write operations.

According to another aspect of the semiconductor integrated circuit in the present invention, the column switch is turned on before the transfer switch is turned on in a write operation. When the column switch is turned on, the transfer switch is kept off; therefore, the level of the bit line immediately turns to that of the write data. The write data are then written to the memory cell simultaneously with the turning-on of the transfer switch. This heightens the speed of write operations.

According to another aspect of the semiconductor integrated circuit in the present invention, the column switch is turned off after the transfer switch is turned off in a write operation. Therefore, the write data are supplied to the memory cell throughout the on period of the transfer switch. Accordingly, write operations are performed with reliability.

According to another aspect of the semiconductor integrated circuit in the present invention, the control unit synchronizes the activation period of the precharging circuit for charging the bit line, with the off-period of the column switch. This makes unnecessary or simplifies the control circuit for controlling the precharging circuit.

According to one of the aspects of a method of controlling a column switch of a semiconductor integrated circuit in a write operation in the present invention, a transfer switch connects a memory element with a bit line. A column switch transmits data to the bit line. A sense amplifier amplifies data transmitted to the bit line. A control unit controls the transfer switch, the column switch, and the sense amplifier. In a write operation, the column switch is turned on after the transfer switch is turned on and before the amplification of the sense amplifier is started.

In this semiconductor integrated circuit, the transfer switch is initially turned on so that the retained data irrelevant to write data are output from a memory cell to the bit line. Next, the column switch is turned on to transmit the write data to the bit line. Then, the retained data are rewritten into the write data before amplified by the sense amplifier. Subsequently, the sense amplifier initiates its amplification. When the retained data and the write data are inverse in logic, the data on the bit line need to be inverted. The data inversion time is, however, minimized since the retained data are rewritten into the write data before amplified by the sense amplifier. This heightens the speed of write operations.

According to another aspect of the method of controlling a column switch of a semiconductor integrated circuit in a write operation in the present invention, a transfer switch connects a memory element with a bit line. A column switch transmits data to the bit line. A sense amplifier amplifies data transmitted to the bit line. A control unit controls the transfer switch, the column switch, and the sense amplifier. In a write operation, the column switch is turned on before the transfer switch is turned on.

Initially, the column switch is turned on to transmit write data to the bit line. At this moment, the retained data in a memory cell is not transmitted to the bit line since the transfer switch is off. Therefore, the level of the bit line immediately turns to that of the write data. Subsequently, the write data is written to the memory cell simultaneously with the turning-on of the transfer switch. This further heightens the speed of write operations.

According to another aspect of the method of controlling a column switch of a semiconductor integrated circuit in a write operation in the present invention, a transfer switch connects a memory element with a bit line. A column switch transmits data to the bit line. A sense amplifier amplifies data transmitted to the bit line. A control unit controls the transfer switch, the column switch, and the sense amplifier. In a write operation, the control unit makes no control of the amplification of the sense amplifier. The data transmitted to the bit line through the column switch is directly written to the memory cell. Since the sense amplifier is disabled in write operations, the power consumption is reduced. Besides, the retained data in the memory cell is not amplified on the bit line. This heightens the speed of write operations.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, the embodiments of the present invention will be described with reference to the accompanying drawings.

Figure 6:
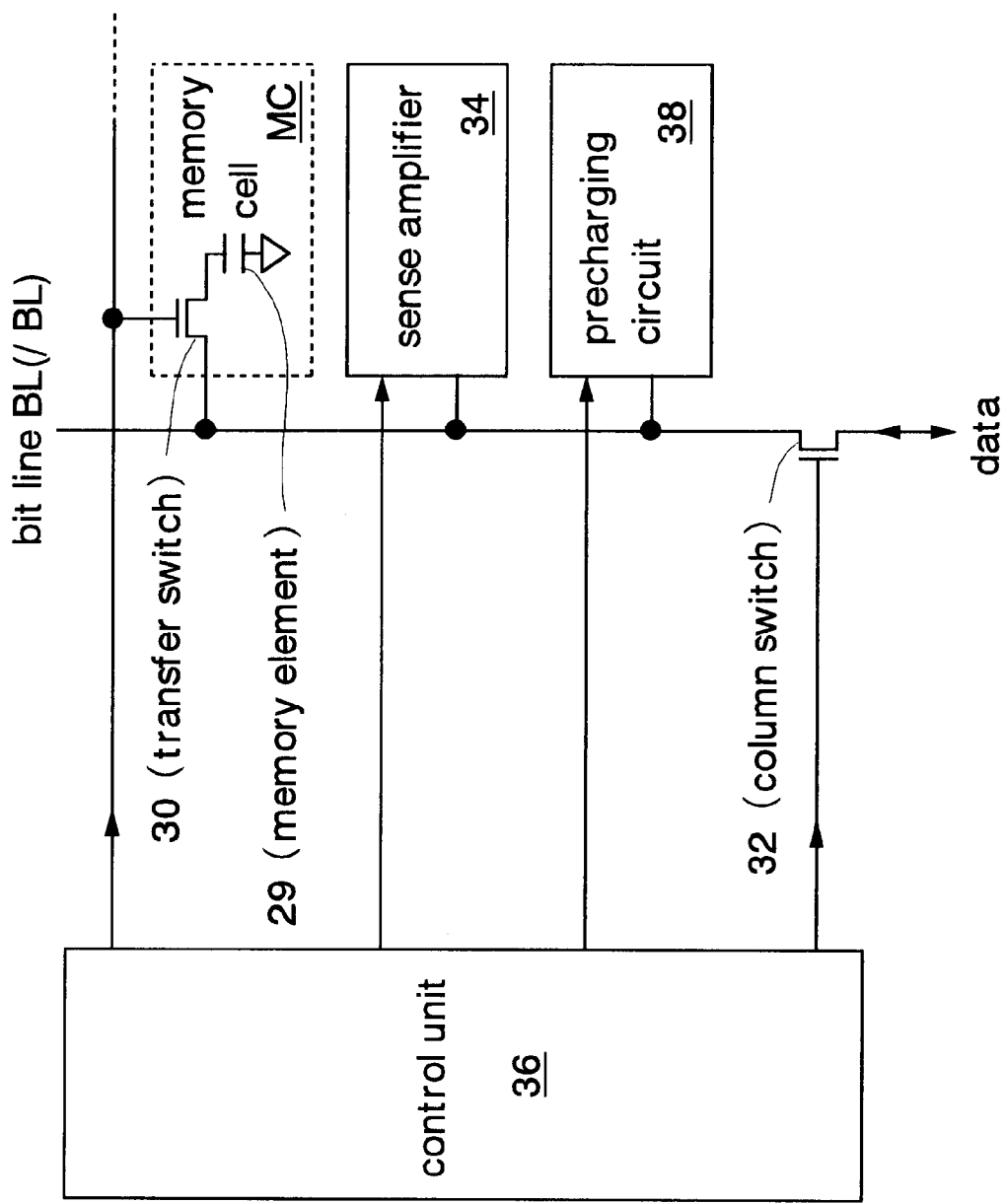
FIG. 6 is a block diagram showing the basic principle of the invention.

FIG. 6 is a block diagram showing the basic principle of the invention.

The semiconductor integrated circuit comprises a memory cell MC having a memory element 29 and a transfer switch 30 for connecting this memory element 29 with a bit line BL (/BL), a column switch 32, a sense amplifier 34, a control unit 36, and a precharging circuit 38. The transfer switch 30 connects the memory element 29 with the bit line BL (/BL). The column switch 32 transmits data to the bit line BL (/BL). The sense amplifier 34 amplifies the data transmitted to the bit line BL (/BL). The precharging circuit 38 charges the bit line BL (/BL) to have a predetermined voltage. The control unit 36 controls the transfer switch 30, column switch 32, and the sense amplifier 34.

For example, in a write operation, the on-timing of the column switch 32 is set after the on-timing of the transfer switch 30 and before the amplification start timing of the sense amplifier 34. Otherwise, in a write operation, the on-timing of the column switch 32 is set before that of the transfer switch 30. Moreover, the control unit 36 of another semiconductor integrated circuit differentiates the timings activation starts in the precharging circuit 38, between a read operation and a write operation. Furthermore, the control unit 36 of another semiconductor integrated circuit makes no control of the amplification of the sense amplifier 34 in a write operation. The writing data to the memory cell MC is directly performed by a write data signal transmitted to the bit line BL (/BL) through the column switch 32.

Figure 7:
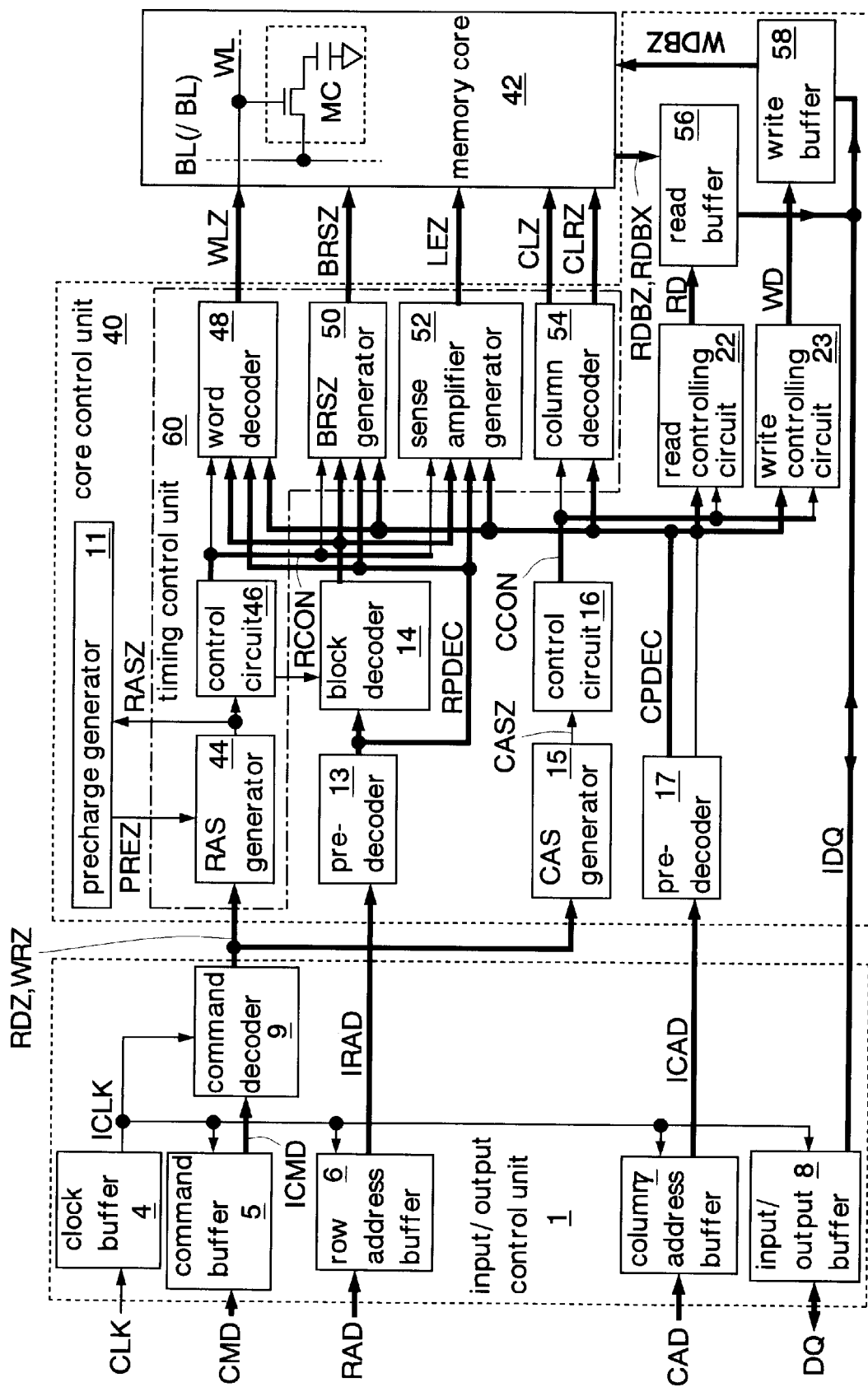
FIG. 7 is a block diagram showing a first embodiment.

FIG. 7 shows a first embodiment of the semiconductor integrated circuit and the method of controlling the column switch of the semiconductor integrated circuit in the write operation in the present invention. The same elements as those discussed in the conventional art will be designated by identical reference numbers, and detailed description thereof will be omitted here.

The semiconductor integrated circuit in this embodiment is formed as a DRAM on a silicon substrate by using a CMOS process technology. The semiconductor integrated circuit comprises an input/output control unit 1, a core control unit 40, and a memory core 42.

The input control unit 1 comprises a clock buffer 4, a command buffer 5, a row address buffer 6, a column address buffer 7, an input/output buffer 8, and a command decoder 9.

The core control unit 40 comprises an RAS generator 44, a precharge generator 11, a control circuit 46, a predecoder 13, a block decoder 14, a CAS generator 15, a control unit 16, a predecoder 17, a word decoder 48, a BRSZ generator 50, a sense amplifier generator 52, a column decoder 54, a read control circuit 22, a write control circuit 23, a read buffer 56, and a write buffer 58. Of the circuits mentioned above, the RAS generator 44, the control circuit 46, the word decoder 48, the BRSZ generator 50, the sense amplifier generator 52, and the column decoder 54 function as a timing control unit 60. Here, the timing control unit 60 corresponds to the control unit 36 in FIG. 6.

The column decoder 54 outputs a column selecting signal CLZ for write and a column selecting signal CLRZ for read.

The read buffer 56 receives the read data signals RDBZ and RDBX from the memory core 42 in synchronization with a read data controlling signal RD, and outputs the same in the form of an internal data signal IDQ. The write buffer 58 receives an internal data signal IDQ in synchronization with a write data controlling signal WD, and outputs the same to the memory core 43 as a write data signal WDBZ.

Figure 1:
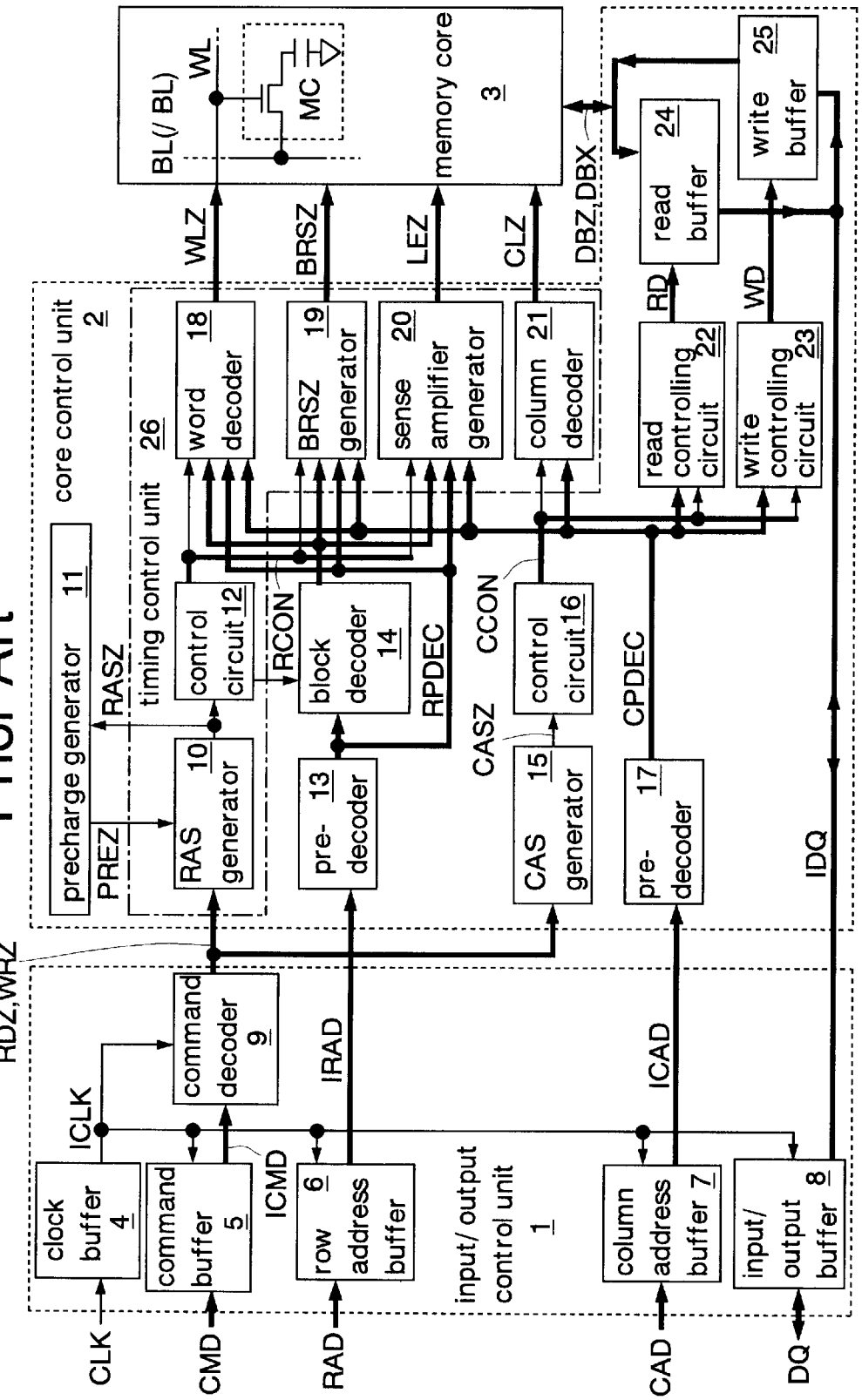
FIG. 1 is a block diagram showing a conventional semiconductor integrated circuit.
Figure 2:
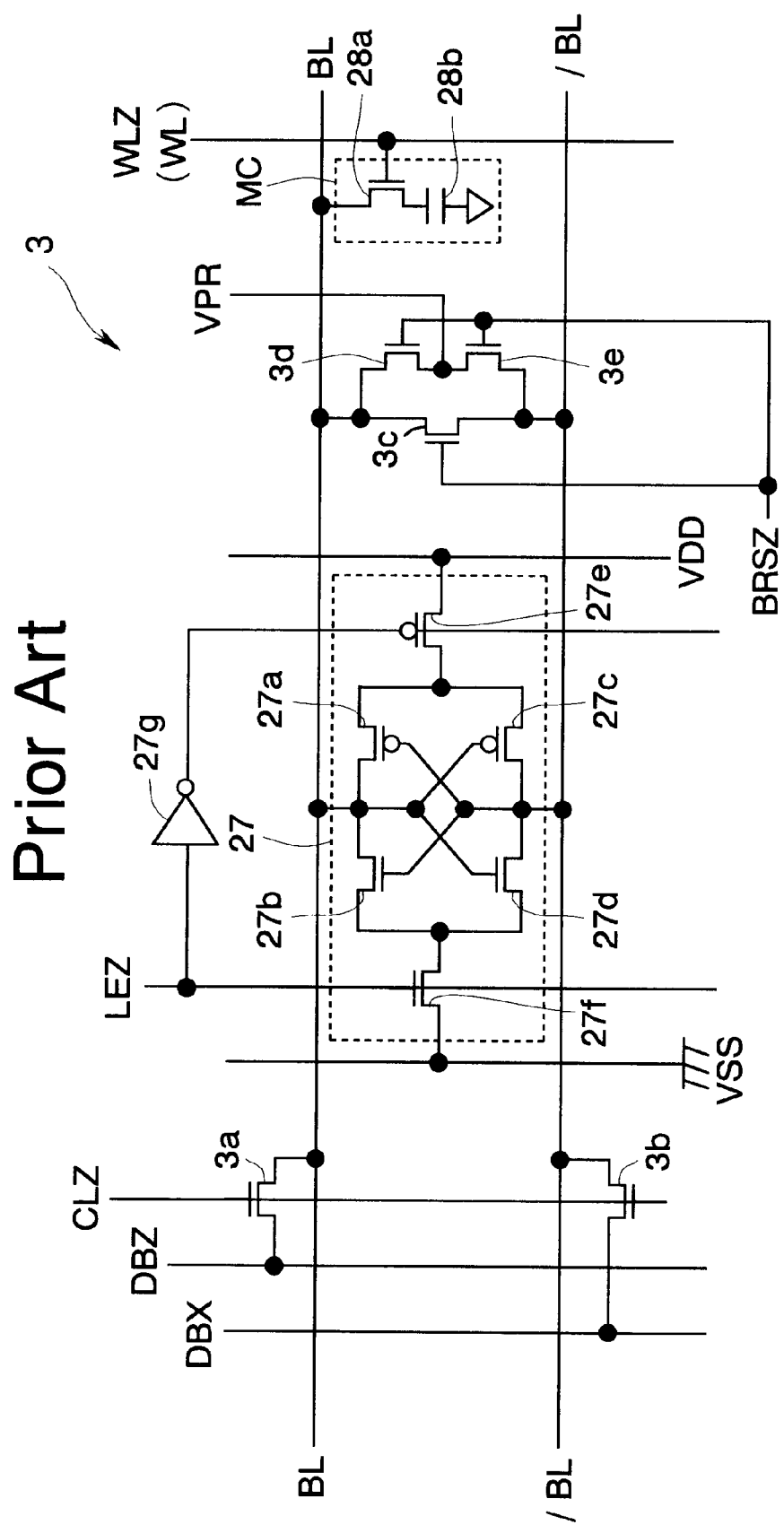
FIG. 2 is a circuit diagram showing the main parts of the memory core in FIG. 1.

In this connection, the wiring of the signals other than the column selecting signals CLZ and CLRZ, the write data signals RDIBZ and RDBX, and the write data signal WDBZ is identical with that of the conventional art in FIG. 1; therefore, the description thereof will be omitted here.

Figure 8:
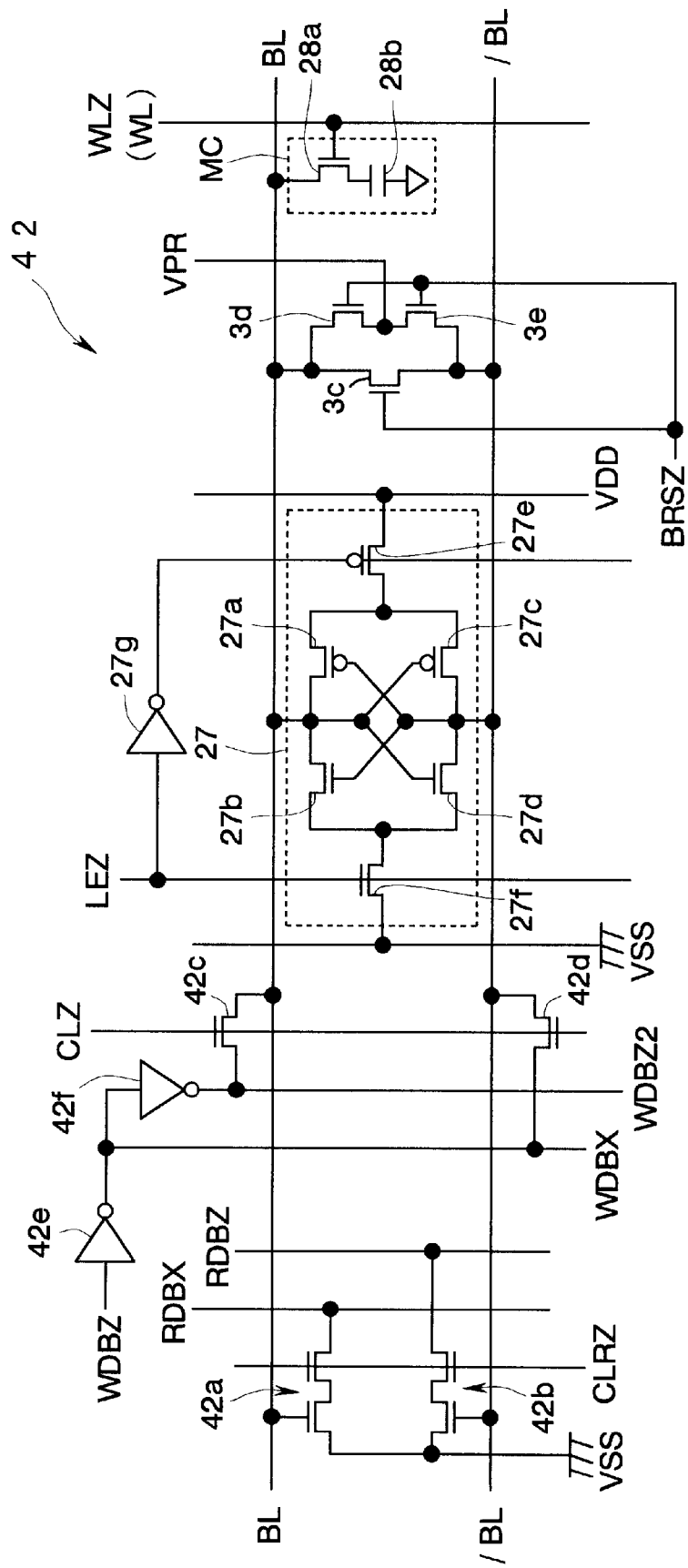
FIG. 8 is a circuit diagram showing the main parts of the memory core in FIG. 7.

FIG. 8 shows the main parts of the memory core 42.

The memory core 42 comprises column switches 42a and 42b for read and consisting of two nMOSs connected in series, column switches 42c and 42d for write, a sense amplifier 27, an nMOS 3c for equalization, nMOSs 3d and 3e for precharge, and a memory cell MC, which are connected to complementary bit lines BL and /BL.

The column switch 42a is connected with a ground line VSS at one end, and outputs the read data signal RDBX from the other end. The gate of the nMOS on the one end of the column switch 42a is connected to the bit line BL. The gate of the nMOS on the other end of the column switch 42a receives the column selecting signal CLRZ for read.

The column switch 42b is connected with the ground line VDD at one end, and outputs the read data signal RDBZ from the other end. The gate of the nMOS on the one end of the column switch 42b is connected to the bit line /BL. The gate of the nMOS on the other end of the column switch 42b receives the column selecting signal CLRZ for read.

That is, in this embodiment, the bit lines BL, /BL and the signal lines of the read data signals RDBX, RDBZ are prevented from direct connection with each other even when the column selecting signal CLRZ is turned to high level. The data on the bit lines BL and /BL are supplied to the gates of the nMOSs of the respective column switches 42a and 42b, and converted into the read data signals RDBX and RDBZ. Due to such circuit configuration, read operations can be performed properly even if the column selecting signal CLRZ is turned to high level before the data read from the memory cell MC are amplified completely.

The source and the drain of the column switch 42c are connected to the bit line BL and a write data signal WDBZ2, respectively. The source and the drain of the column switch 42d are connected to the bit line /BL and a write data signal WDBX, respectively. The inverter 42e receives the write data signal WDBZ, and outputs the write data signal WDBX. The inverter 42f receives the write data signal WDBX, and outputs the write data signal WDBZ2. The gates of the column switches 42c and 42d receive the column selecting signal CLZ.

The source and the drain of the nMOS 3c are connected to the bit lines BL and /BL, respectively. Either the sources or the drains of the nMOSs 3d and 3e are connected to the bit lines BL and /BL, respectively, and the others are connected to a precharging line VPR. The gates of the nMOSs 3c, 3d, and 3e receive a bit line controlling signal BRSZ. Incidentally, the nMOSs 3c, 3d, and 3e correspond to the precharging circuit 38 in FIG. 6.

The memory cell MC consists of an nMOS 28a for data transmission and a capacitor 28b. The gate of the nMOS 28a receives a word line signal WLZ. Incidentally, the nMOS 28a and the capacitor 28b correspond to the transfer switch 30 and the memory element 29 in FIG. 6, respectively.

Figure 9:
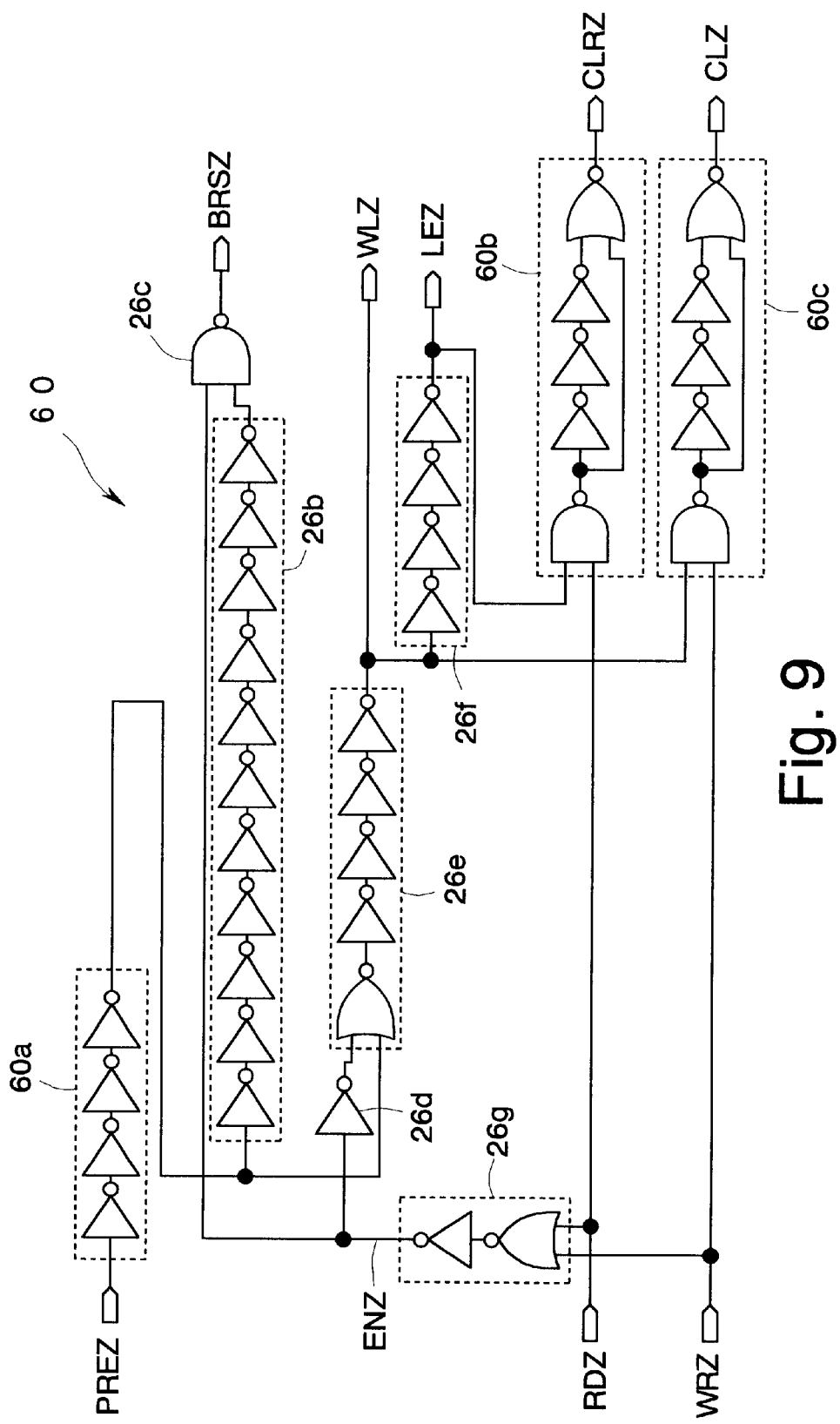
FIG. 9 is a circuit diagram showing the main parts of the timing control unit in FIG. 7.

FIG. 9 shows the details of the main parts of the timing control unit 60.

The timing control unit 60 receives a precharging signal PREZ and control signals RDZ and WRZ, and generates the bit line controlling signal BRSZ, the word line signal WLZ, a sense amplifier activating signal LEZ, and the column selecting signals CLRZ and CLZ with predetermined timings.

Figure 3:
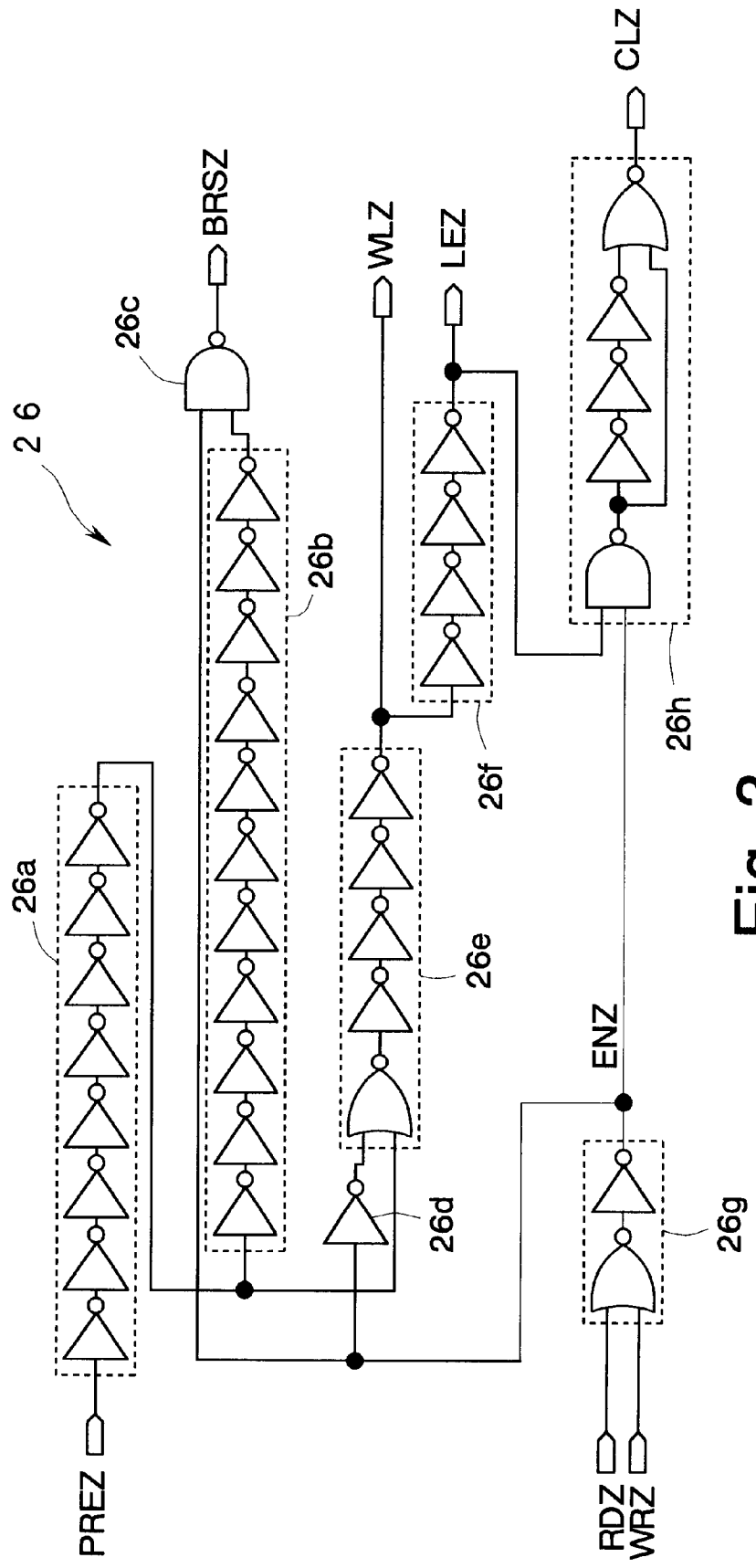
FIG. 3 is a circuit diagram showing the main parts of the timing control unit in FIG. 1.
Figure 4:
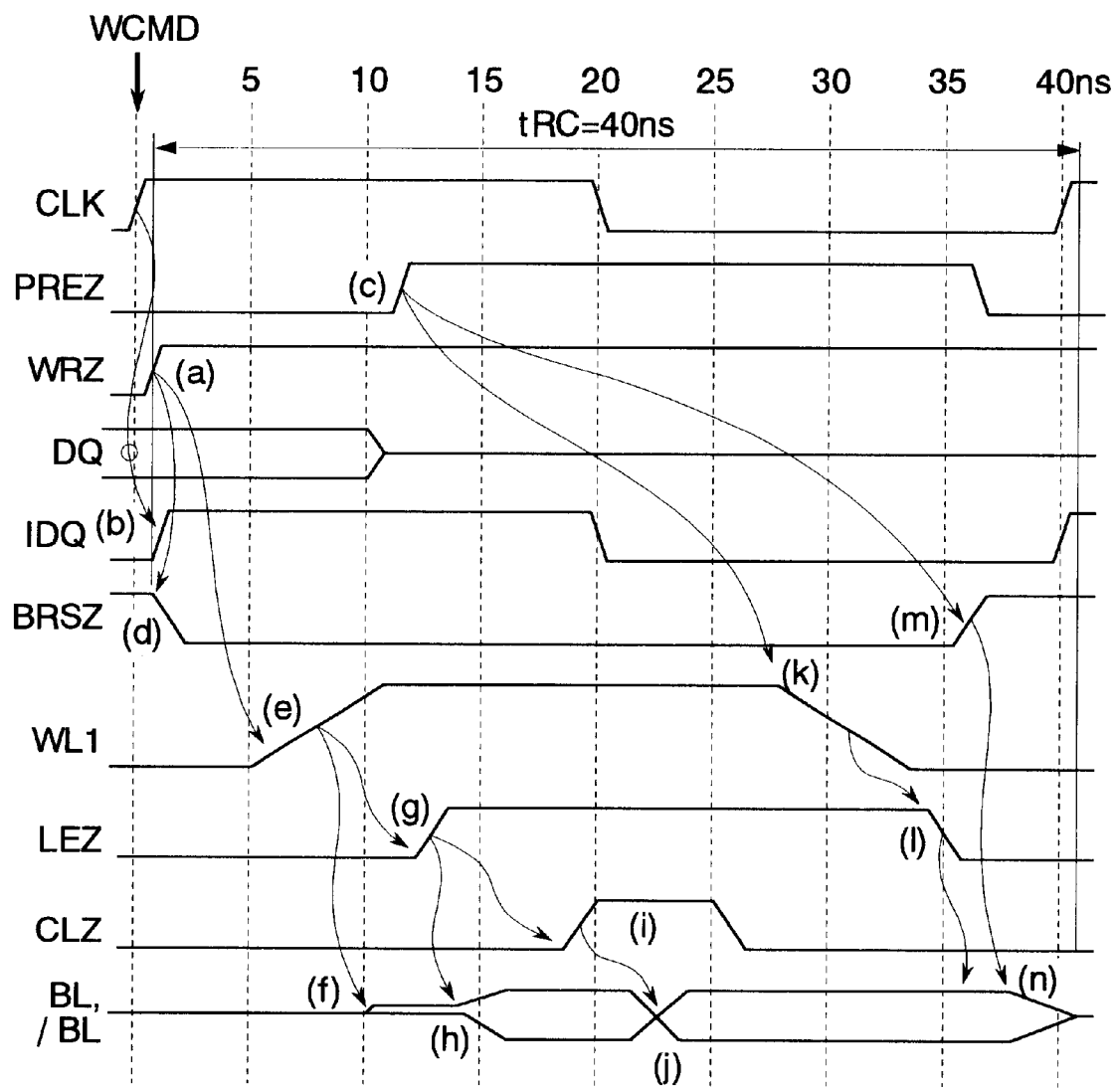
FIG. 4 is a timing chart showing a conventional write operation.
Figure 5:
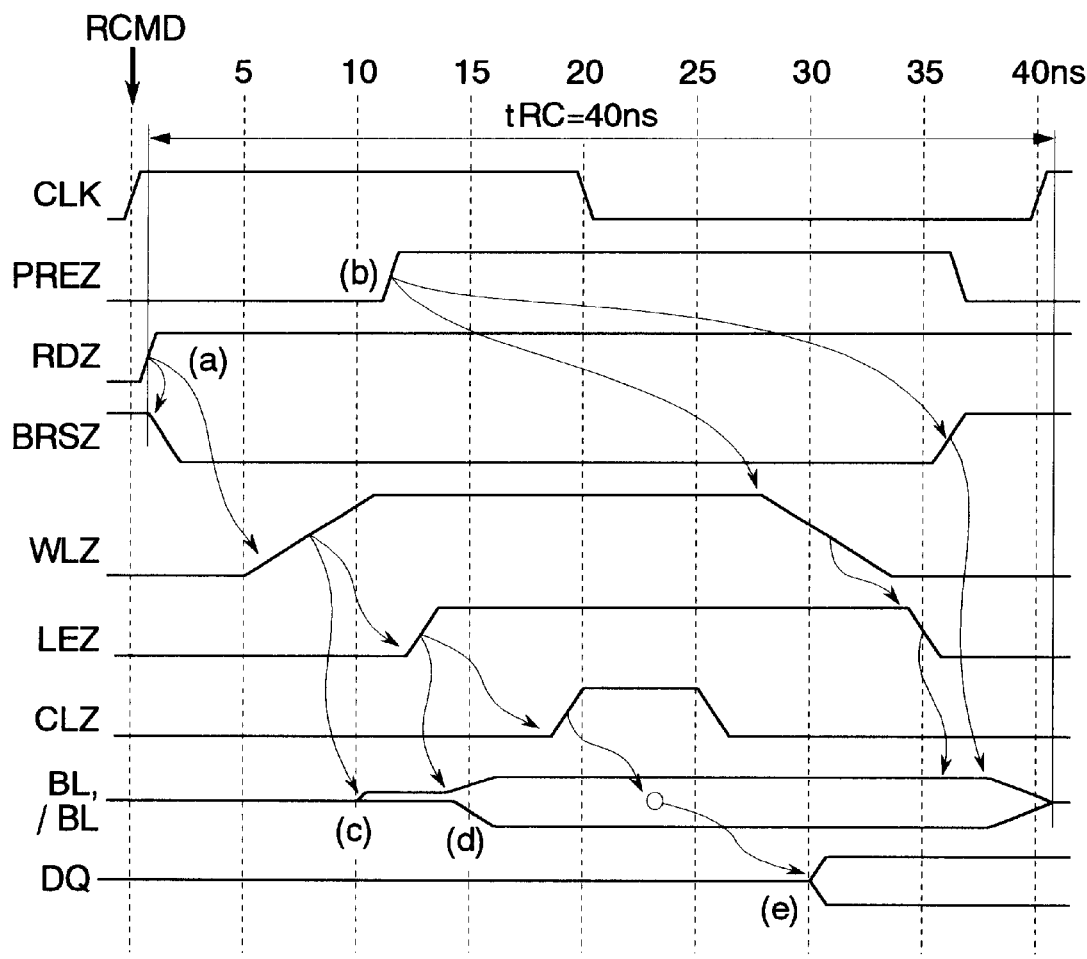
FIG. 5 is a timing chart showing a conventional read operation.

The timing control unit 60 comprises a delay circuit 60a consisting of four inverters connected in cascade, a delay circuit 26b, a NAND gate 26c, an inverter 26d, a NOR circuit 26e, a delay circuit 26f, an OR circuit 26g, a CLRZ generating circuit 60b, and a CLZ generating circuit 60c. The CLRZ generating circuit 60b and the CLZ generating circuit 60c are the same circuits as the CLZ generating circuit 26h shown in FIG. 3.

The delay circuit 60a receives the precharging signal PREZ, and outputs the signal delayed to the delay circuit 26b and the NOR circuit 26e.

The OR circuit 26g receives the control signals RDZ and WRZ, and outputs the received signals as an enable signal ENZ.

The NAND gate 26c receives the enable signal ENZ and the output signal of the delay circuit 26b, and outputs the bit line controlling signal BRSZ.

The NOR circuit 26e receives the output signal of the delay circuit 60a and, through the inverter 26d, the inverted signal of the enable signal ENZ, and outputs the word line signal WLZ.

The delay circuit 26f receives the word line signal WLZ, and outputs the sense amplifier activating signal LEZ.

The CLRZ generating circuit 60b receives the sense amplifier activating signal LEZ and the control signal RDZ, and outputs the column selecting signal CLRZ.

The CLZ generating circuit 60c receives the word line signal WLZ and the control signal WRZ, and outputs the column selecting signal CLZ.

Figure 10:
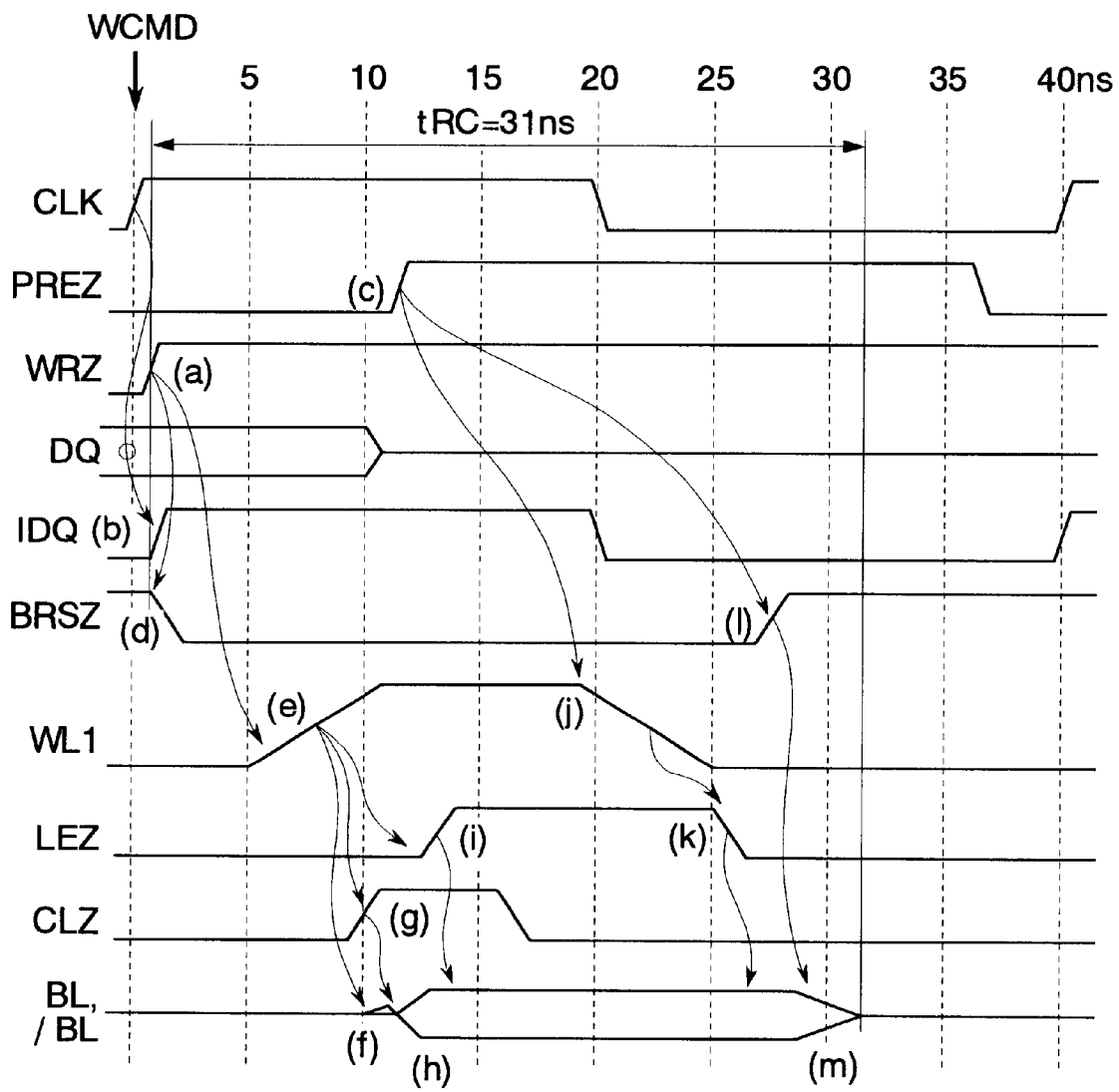
FIG. 10 is a timing chart showing a write operation in the first embodiment.

FIG. 10 shows the timings of the main signals in a write operation.

Initially, the semiconductor integrated circuit accepts a write command (WCMD) and the data signal DQ, along with a row address signal RAD and a column address signal CAD whose waveforms are not shown, in synchronization with the rise of a clock signal CLK. The command decoder 9 shown in FIG. 7 receives the write command, and outputs the control signal WRZ (FIG. 10(a)). The input/output buffer 8 outputs the accepted data signal DQ as the internal data signal IDQ (FIG. 10(b)).

The precharge generator 11 shown in FIG. 7 receives the row controlling signal RASZ output from the RAS generator 10, and turns the precharging signal PREZ to high level after a redetermined time (FIG. 10(c)).

The NAND gate 26c in the timing generator 60 shown in FIG. 9 receives the high level of the control signal WRZ, and turns the bit line controlling signal BRSZ to low level (FIG. 10(d)). Likewise, the NOR circuit 26e receives the high level of the control signal WRZ, and turns the word line signal WLZ to high level (FIG. 10(e)).

In the memory cell MC shown in FIG. 8, the nMOS 28a is turned on under the high level of the word line signal WLZ. The data (storage charge) retained in the memory cell MC are shared in accordance with the capacitance ratio between this memory cell MC and the bit line BL (or /BL). This changes the voltage across the bit lines BL and /BL (FIG. 10(f)).

The above operations are the same as the conventional ones.

Then, the CLZ generating circuit 60c shown in FIG. 9 receives the high level of the word line signal WLZ, and turns the column selecting signal CLZ to high level for a predetermined period (FIG. 10(g)).

The column switches 42c and 42d shown in FIG. 8 are turned on under the high level of the column selecting signal CLZ, so that the write data signals WDBZ2 and WDBX are transmitted to the bit lines BL and /BL, respectively. Here, the sense amplifier 27 is disabled, and therefore the data output from the memory cell MC will not be amplified. Accordingly, the signal inverting operation can be performed easily (FIG. 10 (h)). The write data signal WDBZ2 (or WDBX) transmitted to the bit line BL (or /BL) is also written to the memory cell MC. That is, advancing the activation timing of the column selecting signal CLZ than the activation timing of the sense amplifier 27 allows the inverting operation to be performed in a short time, whereby the write operation to the memory cell MC is performed quickly.

In this connection, the inverters 42e and 42f connected to the column switches 42c and 42d shown in FIG. 8 have such a driving power that the bit lines BL and /BL are set to the predetermined voltages without the sense amplifier 27.

Then, the delay circuit 26f in the timing control unit 60 receives the word line signal WLZ, and turns the sense amplifier activating signal LEZ to high level (FIG. 10(i)).

The sense amplifier 27 shown in FIG. 8 is activated under the high level of the sense amplifier activating signal LEZ, so that the signals on the bit lines BL and /BL are amplified. Due to the amplifying operation of the sense amplifier 27, the bit lines BL and /BL are kept at the predetermined voltages even after the column selecting signal CLZ is turned to low level.

In this embodiment, it takes approximately 3 ns from the activation of the column selecting signal CLZ to the activation of the sense amplifier activating signal LEZ. This prevents the activation of the column selecting signal CLZ from lagging behind the activation of the sense amplifier activating signal even if the voltage, temperature, and fabrication processes vary within the specifications. That is, there is no possibility that the sense amplifier 27 performs the amplification (inverting operation) of the data output from the memory cell MC.

Subsequently, the NOR circuit 26e shown in FIG. 9 receives the precharging signal PREZ transmitted through the delay circuit 60a, and turns the word line signal WLZ to low level (FIG. 10(j)). Under the low level of the word line signal WLZ, the nMOS 28a in the memory cell MC is turned off to finish the data write.

The delay circuit 26f receives the word line signal WLZ, and turns the sense amplifier activating signal LEZ to low level (FIG. 10(k)). The sense amplifier 27 shown in FIG. 8 is inactivated under the low level of the sense amplifier activating signal LEZ, thereby completing the amplifying operation to the data signals WDBZ2 and WDBZ transmitted to the bit lines BL and /BL.

Then, the NAND gate 26c shown in FIG. 9 receives the inverted signal of the precharging signal PREZ transmitted through the delay circuits 60a and 26b, and turns the bit line controlling signal BRSZ to high level (FIG. 10(l)).

The nMOSs 3c, 3d, and 3e shown in FIG. 8 are turned on under the high level of the bit line controlling signal BRSZ. The bit lines BL and /BL are connected to the precharging line VPR, and equalized at the same time. Then, the bit lines BL and /BL are precharged to complete the write operation (FIG. 10(m)).

In the write operation of this embodiment, the cycle time tRC, which is a period from the falling edge of the bit line controlling signal BRSZ to the precharge of the bit lines BL and /BL, is 31 ns. This is 9 ns shorter than conventional.

Figure 11:
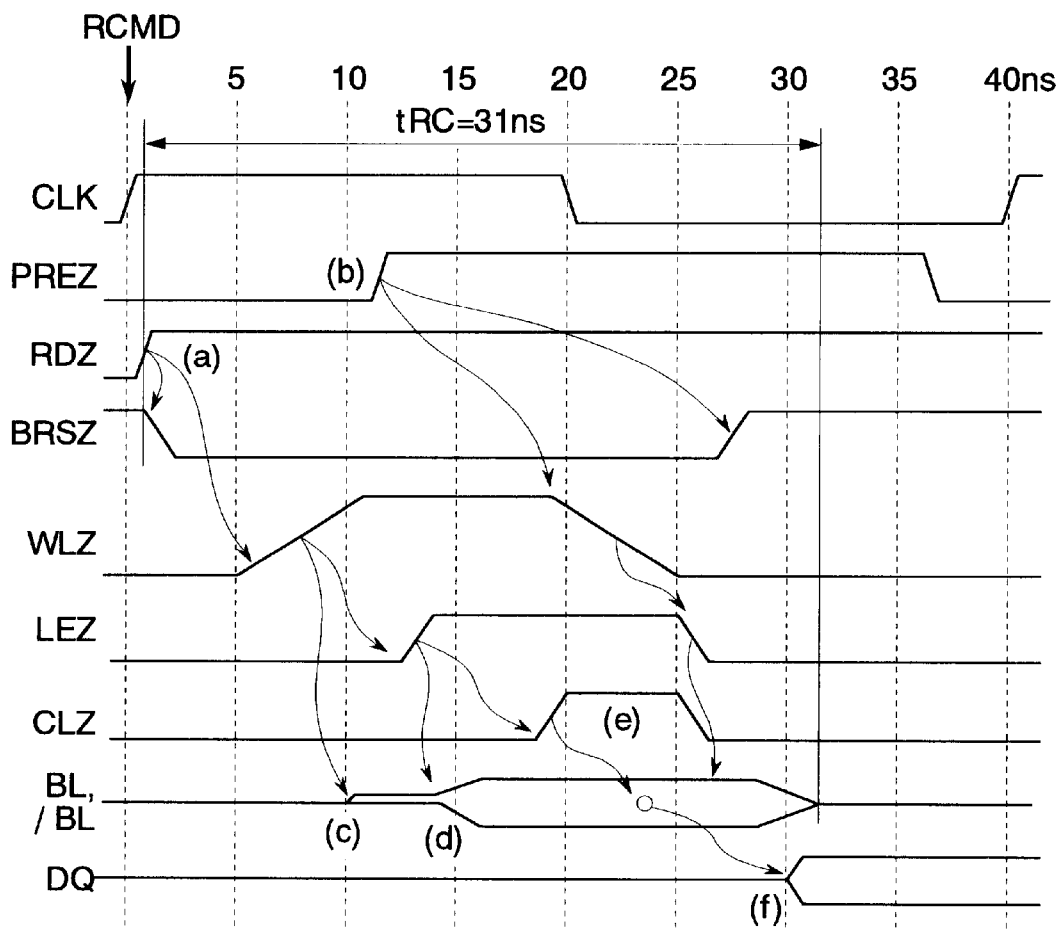
FIG. 11 is a timing chart showing a read operation in the first embodiment.

FIG. 11 shows the timings of the main signals in a read operation.

Initially, the semiconductor integrated circuit accepts a read command (RCMD) along with the row address signal RAD and column address signal CAD whose waveforms are not shown, in synchronization with the rise of the clock signal CLK. The command decoder 9 shown in FIG. 7 receives the read command, and outputs the control signal RDZ (FIG. 11(a)).

The precharge generator 11 shown in FIG. 7 receives the row controlling signal RASZ output from the RAS generator 44, and turns the precharging signal PREZ to high level after a predetermined time (FIG. 11(b)).

Subsequently, the bit line controlling signal BRSZ, the word line signal WLZ, and the sense amplifier activating signal LEZ are output at the same timing as that of the control signal WRZ in the write operation described above.

In the memory cell MC shown in FIG. 8, the nMOS 28a is turned on under the high level of the word line signal WLZ. The data retained in the memory cell MC appear as the weak potential difference between the bit lines BL and /BL (FIG. 11(c)).

The sense amplifier 27 is activated under the high level of the sense amplifier activating signal LEZ, so that the potential difference between the bit lines BL and /BL is amplified (FIG. 11(d)).

The CLRZ generating circuit 60b shown in FIG. 9 receives the high level of the sense amplifier activating signal LEZ, and turns the column selecting signal CLRZ to high level for a predetermined period (FIG. 11(e)).

The column switches 42a and 42b shown in FIG. 8 are turned on under the high level of the column selecting signal CLRZ, so that the voltages on the bit lines BL and /BL are transmitted as the read data signals RDBZ and RDBZ. The input/output buffer 8 shown in FIG. 7 outputs the read data signals RDBX and RDBZ (the internal data signal IDQ) received by the read buffer 56 to the chip exterior as the data signal DQ (FIG. 11(f)). This completes the read operation.

In the read operation of this embodiment, the control timings of the internal circuits need not be determined with consideration given to the data inversion time in a write operation. Therefore, the cycle time tRC is 31 ns, which are 9 ns shorter than conventional.

As has been described above, in the semiconductor integrated circuit and the method of controlling the column switch of the semiconductor integrated circuit in the write operation in the present invention, the activation timing of the column selecting signal CLZ is set before the activation timing of the sense amplifier 27. Accordingly, the data output from the memory cell MC can be rewritten by the write data before being amplified by the sense amplifier 27. Therefore, the data inversion time can be minimized to perform write operations at high speed.

Moreover, the cycle time in read operations can also be shortened since the data inversion time in write operations need not be taken into account.

Figure 12:
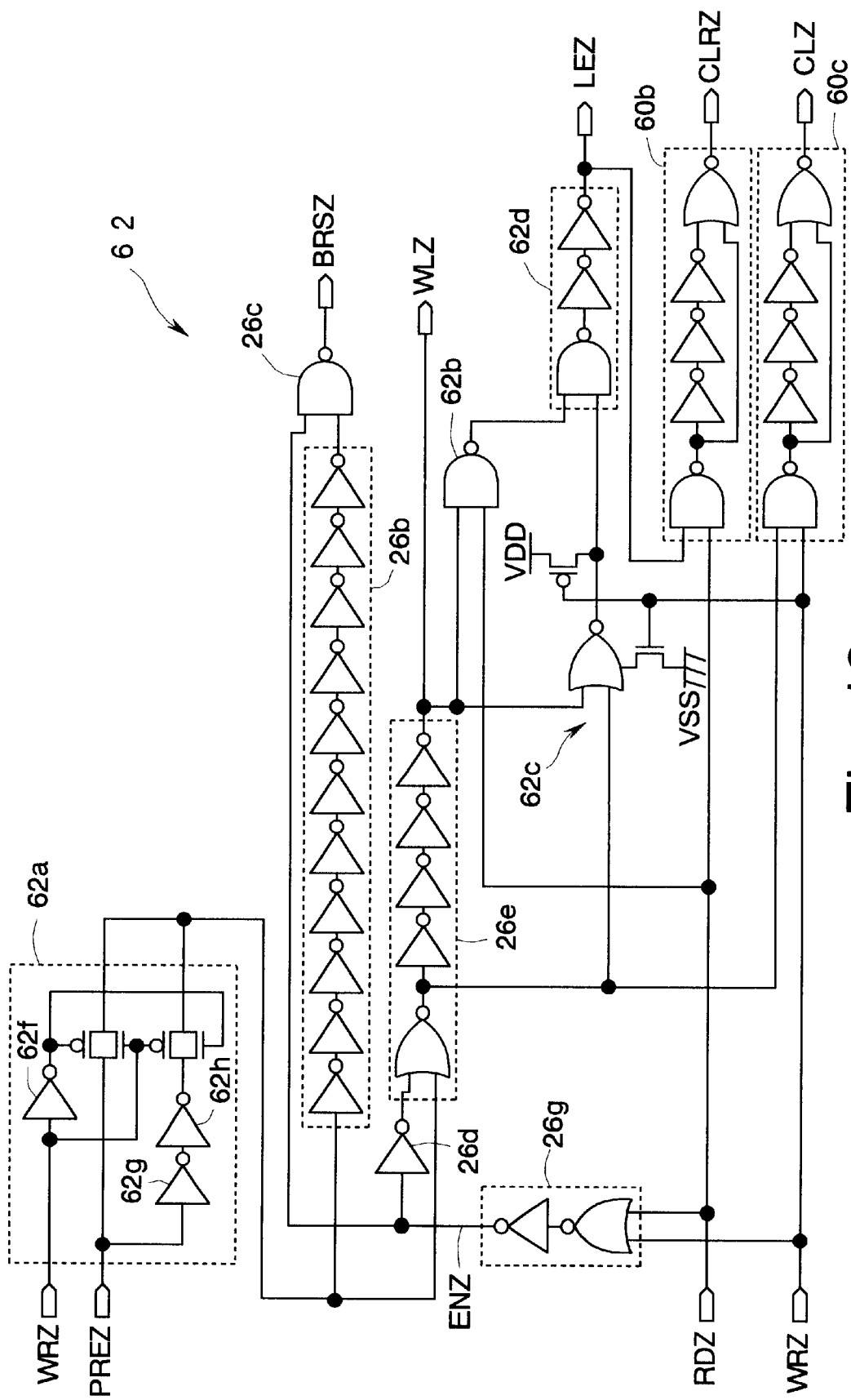
FIG. 12 is a circuit diagram showing the main parts of the timing control unit in a second embodiment.

FIG. 12 shows the main parts of the timing control unit 62 in a second embodiment of the semiconductor integrated circuit according to the present invention. The same elements as those discussed in the conventional art and those of the first embodiment will be designated by identical reference numbers, and detailed description thereof will be omitted here.

In this embodiment, the timing control unit 62 differs from the timing control unit 60 of the first embodiment. The other configuration is the same as that of the first embodiment.

The timing control unit 62 comprises a switching circuit 62a, a delay circuit 26b, a NAND gate 26c, an OR circuit 26g, an inverter 26d, a NOR circuit 26e, a two-input NAND gate 62b, a NOR circuit 26c, a two-input NAND circuit 62d, a CLRZ generating circuit 60b, and a CLZ generating circuit 60c.

The switching circuit 62a comprises: CMOS switches 62d and 62e consisting of nMOSs and pMOSs whose sources and drains are connected to each other; and inverters 62f, 62g, and 62h. Each of the gates of the CMOS switches 62d and 62e is controlled by a control signal WRZ or the control signal WRZ through the inverter 62f, so that either one of the switches 62d and 62e is turned on. The input of the CMOS switch 62d receives a precharging signal PREZ directly, and the input of the CMOS switch 62e receives the precharging signal PREZ through the inverters 62g and 62h. The outputs of the CMOS switches 62d and 62e are connected to each other, and connected to the input of the delay circuit 26b and the input of the NOR circuit 26e. The switching circuit 62a transmits the intact precharging signal PREZ when the control signal WRZ is at high level, and transmits the precharging signal PREZ delayed by the inverters 62g and 62h when the control signal WRZ is at low level.

The OR circuit 26g receives control signals RDZ and WRZ, and outputs the received signals as an enable signal ENZ.

The NAND gate 26c receives the enable signal ENZ and the output signal of the delay circuit 26b, and outputs a bit line controlling signal BRSZ.

The NOR circuit 26e receives the output signal of the switching circuit 62q and, through the inverter 26d, the inverted signal of the enable signal ENZ, and outputs a word line signal WLZ.

The NAND gate 62b receives the word line signal WLZ and the control signal RDZ, and delivers its output signal to the NAND circuit 62d. The NAND gate 62b is activated when the control signal RDZ is at high level.

The NOR circuit 62c comprises: a NOR gate; an nMOS for control, connected to the nMOSs (not shown) in the NOR gate; and a pMOS for control, connected to the output of the NOR gate. Each of the nMOSs (not shown) in the NOR gate is connected to a ground line VSS through the nMOS for control. The output of the NOR gate is connected to a power supply line VDD through the pMOS for control. The gates of the nMOS and pMOS for control receive the control signal WRZ. The NOR circuit 62c receives the output signal of the NOR gate formed at the first stage of the NOR circuit 26e and the word line signal WLZ, and delivers its output signal to the NAND circuit 62d. The NOR circuit 62c is activated when the control signal WRZ is at high level, and turns its output to high level when the control signal WRZ is at low level.

The NAND circuit 62d receives the output signal of the NAND gate 62b and the output signal of the NOR circuit 62c, and outputs a sense amplifier activating signal LEZ.

The CLRZ generating circuit 60b receives the sense amplifier activating signal LEZ and the control signal RDZ, and outputs a column selecting signal CLRZ.

The CLZ generating circuit 60a receives the control signal WRZ and the output signal of the NOR gate formed at the first stage of the NOR circuit 26e, and outputs a column selecting signal CLZ.

Figure 13:
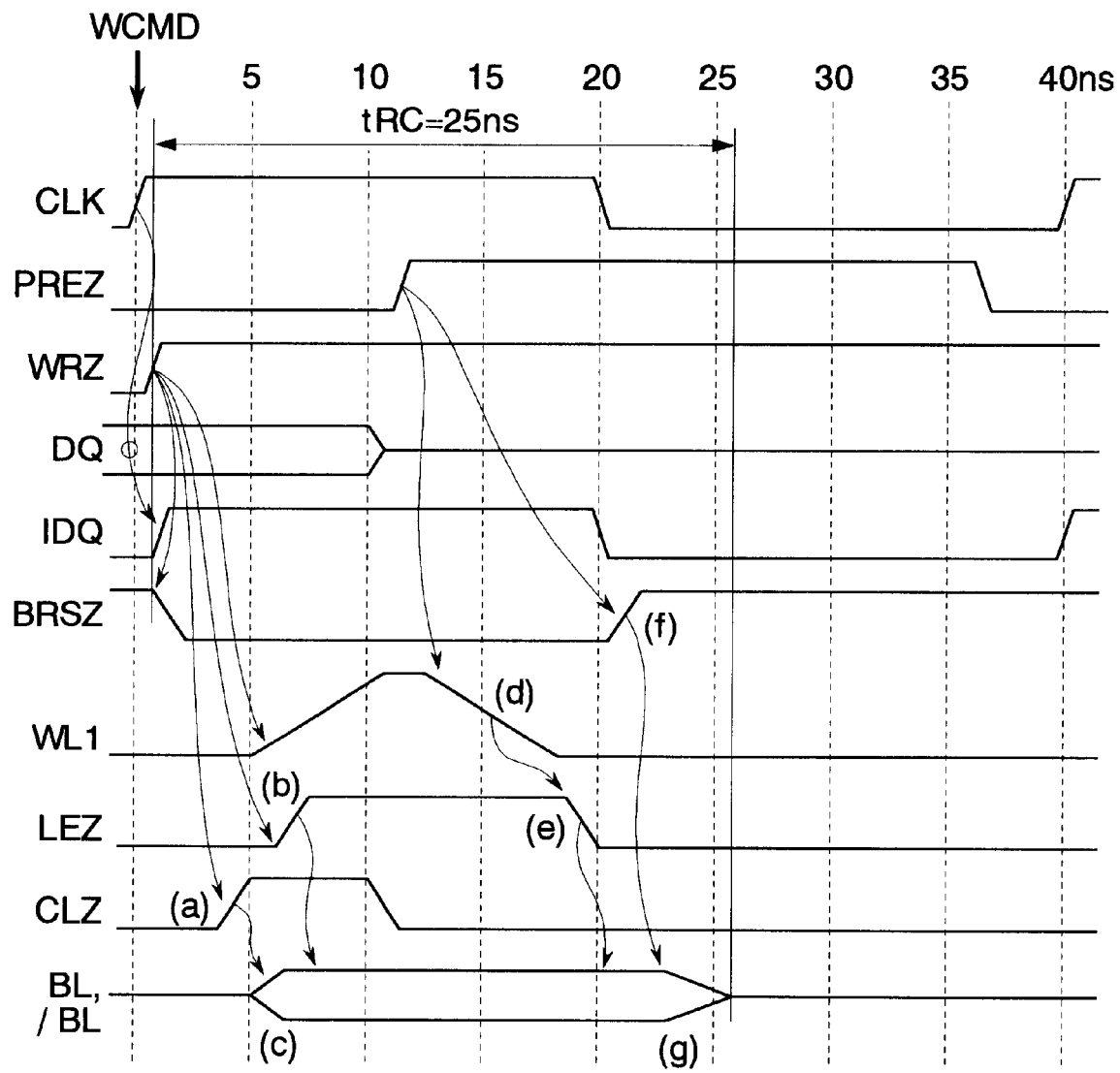
FIG. 13 is a timing chart showing a write operation in the second embodiment.

FIG. 13 shows the timings of the main signals in a write operation. Here, the same operations as those of the first embodiment will be omitted from the following description.

In this embodiment, both the high level of the column selecting signal CLZ and the high level of the sense amplifier activating signal LEZ are generated from the control signal WRZ.

That is, the CLZ generating circuit 60c shown in FIG. 12 receives the output signal from NOR gate in the NOR circuit 26e, and turns the column selecting signal CLZ to high level (FIG. 13(a)). Likewise, the NOR circuit 62c shown in FIG. 12 receives the output signal from the NOR gate in the NOR circuit 26e, and turns the sense amplifier activating signal LEZ to high level (FIG. 13(b)).

The column selecting signal CLZ is activated before the word line signal WLZ and the sense amplifier activating signal LEZ. Due to the activation of the column selecting signal CLZ, write data signals WDBX and WDBZ2 are transmitted to the bit lines BL and /BL through the column switches 42c and 42d shown in FIG. 8. Here, the nMOS 28a in the memory cell MC is off, and therefore the retained data in the memory cell MC will not be transmitted to the bit lines BL and /BL. Therefore, the levels of the bit lines BL and /BL immediately turn to those of the write data signals WDBX and WDBZ2 (FIG. 13(c)).

Then, the nMOS 28a is turned on under the activation of the word line signal WLZ, so that the write data are written to the memory cell MC. The sense amplifier 27 operates after the voltages of the bit lines BL and /BL are set to the logical levels of the write data signals WDBX and WDBZ2. Accordingly, there is no possibility that the inverted signals of the write data signal WDBX and WDBZ2 are supplied to the bit lines BL and /BL, nor that the inverted signals are amplified.

Subsequently, the word line signal WLZ is turned to low level in response to the high level of the precharging signal PREZ (FIG. 13(d)). The NAND gate 62b and the NAND circuit 62d shown in FIG. 12 receive the low level of the word line signal WLZ, and turn the sense amplifier activating signal LEZ to low level (FIG. 13(e)).

Besides, the bit line controlling signal BRSZ is turned to high level in response to the high level of the precharging signal PREZ (FIG. 13(f)). Then, the bit lines BL and /BL are precharged to complete the write operation (FIG. 13(g)).

In the write operation of this embodiment, the cycle time tRC is 25 ns, which are 15 ns shorter than conventional.

Figure 14:
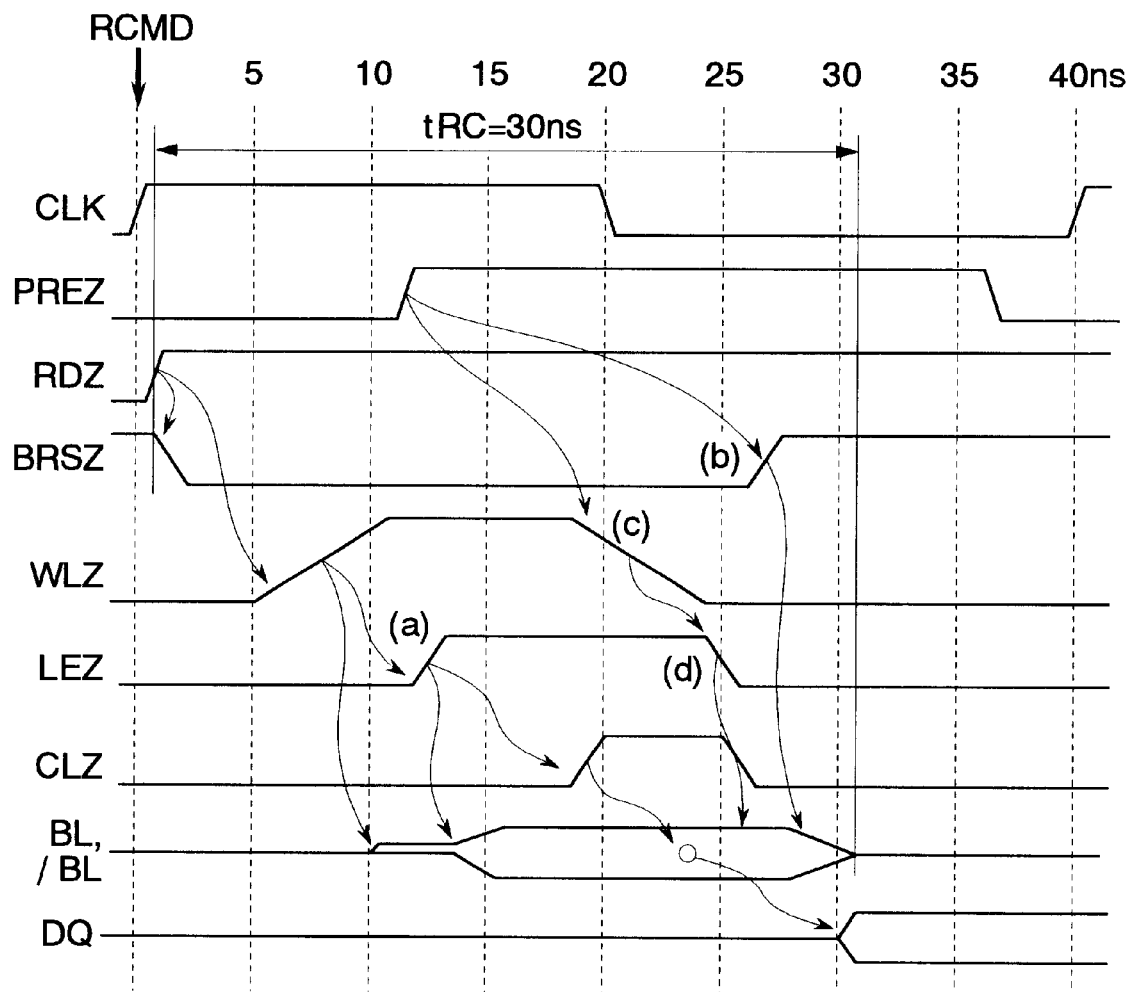
FIG. 14 is a timing chart showing a read operation in the second embodiment.

FIG. 14 shows the timings of the main signals in a read operation.

In the read operation of this embodiment, the NAND gate 62b shown in FIG. 12 receives the high level of the word line signal WLZ, and turns the sense amplifier activating signal LEZ to high level (FIG. 14(a)). Accordingly, the activation timing of the sense amplifier activating signal LEZ is later than in a write operation. Since the sense amplifier 27 is activated at the optimum timing for a read operation, the power consumption is reduced.

In addition, the switching circuit 62a shown in FIG. 12 transmits the high level of the precharging signal later than in a write operation. Therefore, the activating timings of the bit line controlling signal BRSZ, the word line signal WLZ, and the sense amplifier activating signal LEZ become later than in a write operation (FIG. 14(b), (c), and (d)). Consequently, the cycle time tRC is 30 ns, which is 1 ns shorter than in the first embodiment.

The semiconductor integrated circuit of this embodiment can also offer the same effect as that obtained from the first embodiment described above. Moreover, in this embodiment, the activation timing of the column selecting signal CLZ in a write operation is set before the activation timing of the word line signal. The retained data in the memory cell MC are therefore not output, whereby the bit line voltages can turn to the logical levels of the write data immediately. This further heightens the speed of write operations.

Besides, in read operations and write operations, the precharging operation can be performed at the respective optimum timings, thereby allowing a reduction in power consumption. Since the timings of the read control and the write control can be optimized individually, both read operations and write operations can be performed at high speed.

The amplification start timing of the sense amplifier 27 is optimized for a write operation and a read operation individually. This eliminates the needless amplification periods of the sense amplifier 27, allowing a reduction in power consumption.

Figure 15:
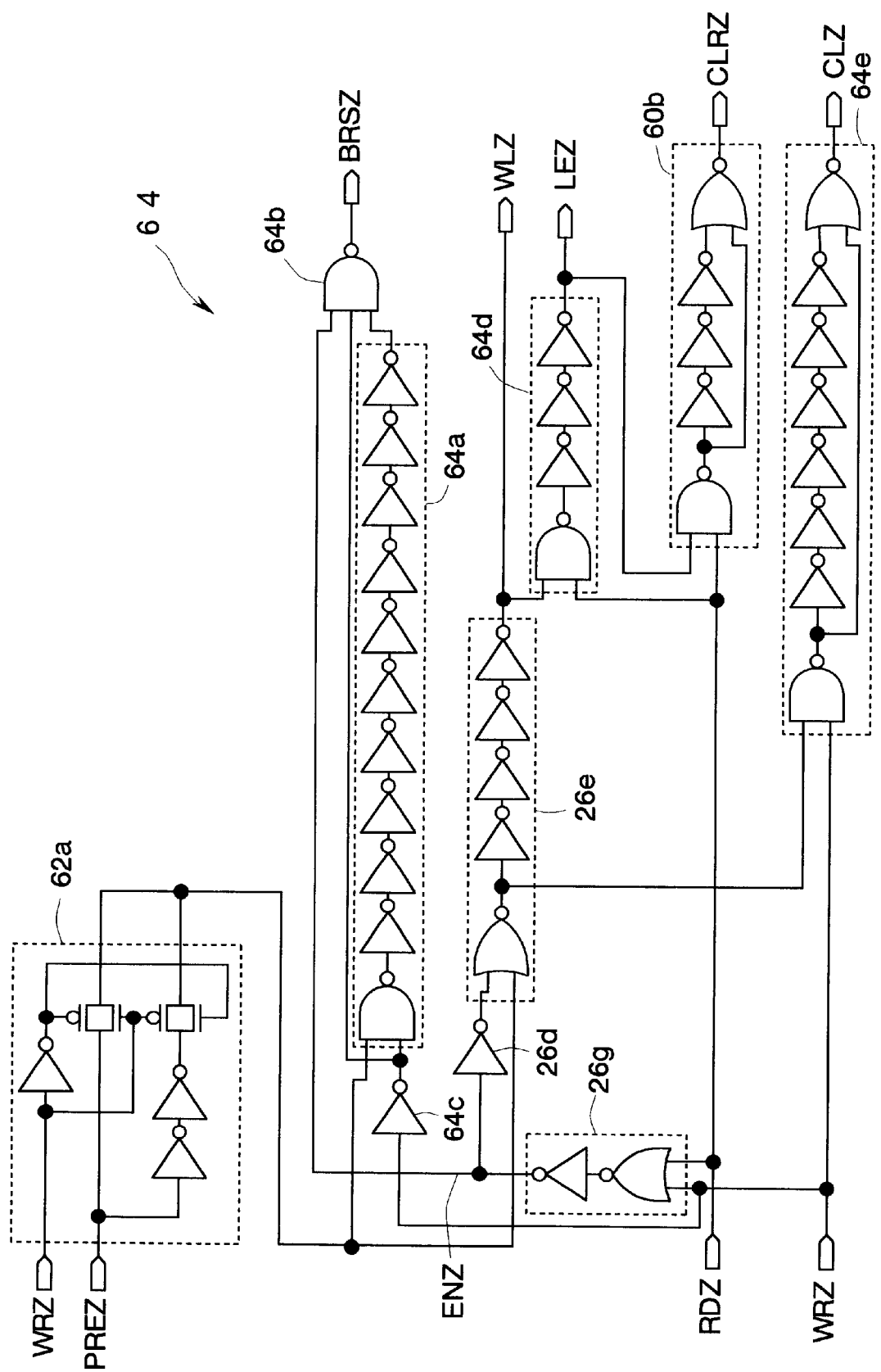
FIG. 15 is a circuit diagram showing the main parts of the timing control unit in a third embodiment.

FIG. 15 shows the main parts of the timing control unit 64 in a third embodiment of the semiconductor integrated circuit according to the present invention. The same elements as those discussed in the conventional art and those of the embodiments described above will be designated by identical reference numbers, and detailed description thereof will be omitted here.

This embodiment differs from the first embodiment in the timing control unit 64 and the memory core 66 to be described later. The other configuration is the same as that of the first embodiment.

The timing control unit 64 comprises a switching circuit 62a, a two-input NAND circuit 64a, a three-input NAND gate 64b, an OR circuit 26g, inverters 64c and 26d, a NOR circuit 26e, a two-input AND circuit 64d, a CLRZ generating circuit 60b, and a CLZ generating circuit 64e.

The switching circuit 62a receives a precharging signal PREZ, and outputs the received signal under the control of a control signal WRZ.

The NAND circuit 64a comprises 10 inverters cascaded to the output of a NAND gate. The NAND circuit 64a receives the output signal of the switching circuit 62a and, through the inverter 64c, the inverted signal of the control signal WRZ, and delivers its output signal to the NAND gate 64b.

The NAND gate 64b receives the output signal of the NAND circuit 64a, the output signal of the inverter 64c, and an enable signal ENZ, and outputs a bit line controlling signal BRSZ.

The NOR circuit 26e receives the output signal of the switching circuit 62a and, through the inverter 26d, the inverted signal of the enable signal ENZ, and outputs a word line signal WLZ.

The NAND circuit 64d receives the word line signal WLZ and a control signal RDZ, and outputs a sense amplifier activating signal LEZ.

The CLRZ generating circuit 60b receives the sense amplifier activating signal LEZ and the control signal RDZ, and outputs a column selecting signal CLRZ.

The CLZ generating circuit 64e includes three inverters to be cascaded more than the CLRZ generating circuit 60b. That is, the output signal of the CLZ generating circuit 64e has a pulse width greater than that of the CLRZ generating circuit 60b. The CLZ generating circuit 64e receives the output signal of the NOR gate in the NOR circuit 26e and the control signal WRZ, and outputs a column selecting signal CLZ.

Figure 16:
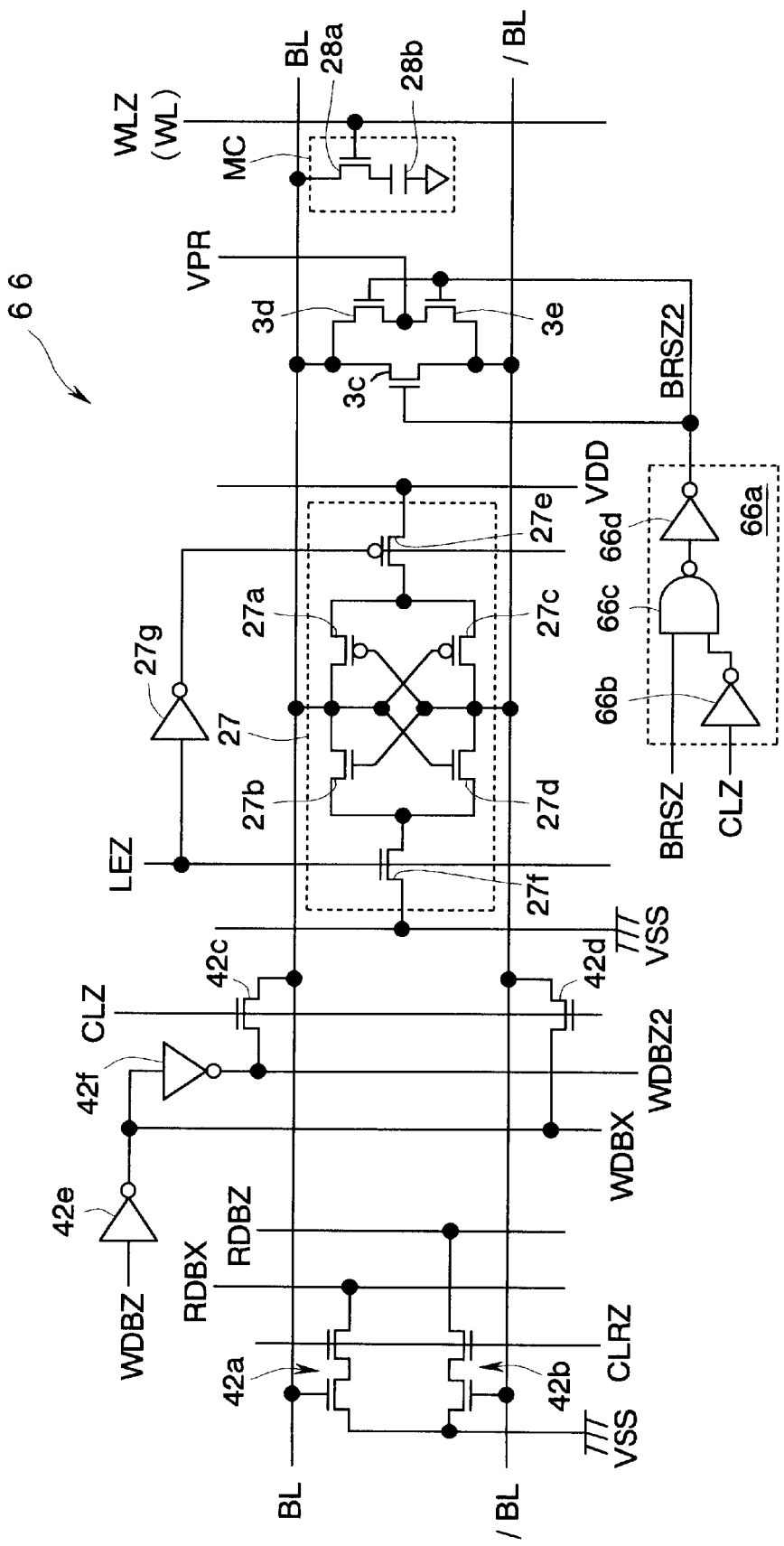
FIG. 16 is a circuit diagram showing the main parts of the memory core in the third embodiment.

FIG. 16 shows the main parts of the memory core 66.

The memory core 66 comprises a precharge control circuit 66a. The other configuration is the same as that in FIG. 8 described above. The precharge control circuit 66a is composed of a two-input NAND gate 66b and inverters 66c and 66d. The NAND gate 66b receives the bit line controlling signal BRSZ and, through the inverter 66c, the inverted signal of the column selecting signal CLRZ, and outputs the received signals to the inverter 66d. The inverter 66d inverts the signal received from the NAND gate 66b, and outputs the resultant as a bit line controlling signal BRSZ2. The bit line controlling signal BRSZ2 is supplied to the nMOSs 3c, 3d, and 3e.

Figure 17:
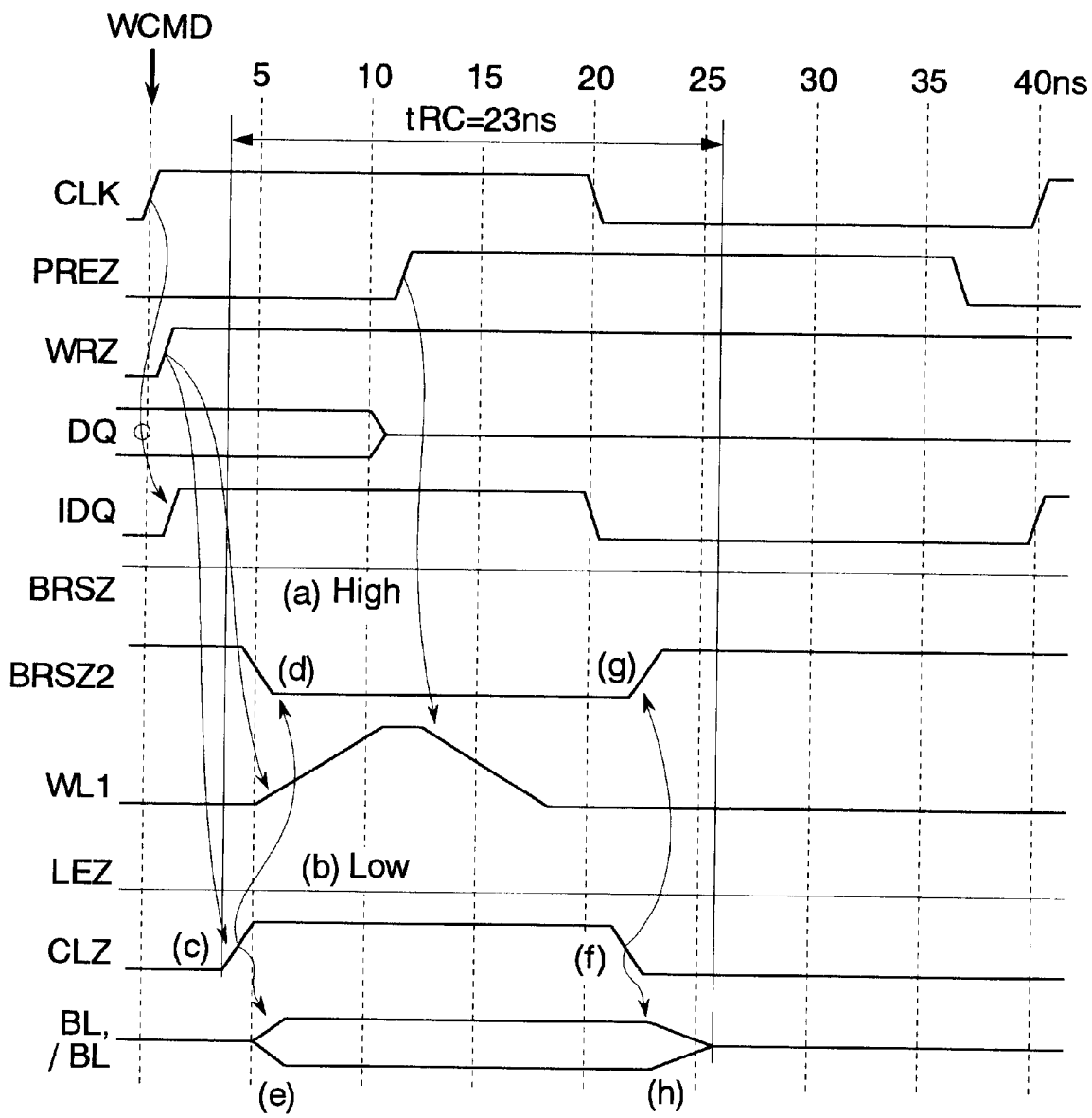
FIG. 17 is a timing chart showing a write operation in the third embodiment.

FIG. 17 shows the timings of the main signals in a write operation. Incidentally, the same operations as those in the embodiments described above will be omitted from the following description.

In this embodiment, when the control signal WRZ is at high level (a write operation), the NAND gate 64b shown in FIG. 15 receives the low level of the same through the inverter 64c, and keeps the bit line controlling signal BRSZ at high level (FIG. 17(a)).

The AND circuit 64d receives the control signal RDZ of low level, and keeps the sense amplifier activating signal LEZ at low level (FIG. 17(b)). That is, the sense amplifier 27 (FIG. 8) performs no operation.

The CLZ generating circuit 64e receives the output signal from the NOR gate in the NOR circuit 26e, and turns the column selecting signal CLZ to high level (FIG. 17(c)).

The precharge control circuit 66a shown in FIG. 16 receives the high level of the bit line controlling signal BRSZ and the high level of the column selecting signal CLZ, and outputs a signal that carries the inverted logic of the column selecting signal CLZ. That is, during the high-level period of the column selecting signal CLZ, the bit line controlling signal BRSZ2 is set to low level (FIG. 17(d)). During the low-level period of the bit line controlling signal BRSZ2, the bit lines BL and /BL will not be precharged.

Due to the activation of the column selecting signal CLZ, write data signals WDBX and WDBZ2 are transmitted to the bit lines BL and /BL through the column switches 42c and 42d shown in FIG. 16. Here, the nMOS 28a is off, and therefore the retained data in the memory cell MC are not transmitted to the bit lines BL and /BL. Accordingly, the levels of the bit lines BL and /BL immediately turn to those of the write data signals WDBX and WDBZ2 (FIG. 17(e)).

Then, the nMOS 28a is turned on in response to the activation of the word line signal WLZ, so that the write data are written to the memory cell MC without the sense amplifier 27 operating.

Due to the delay from the inverters in the CLZ generating circuit 64e shown in FIG. 15, the column selecting signal CLZ is kept at high level for a predetermined time after the word line signal WLZ is turned to low level (FIG. 17(f)). Therefore, the write data are surely written to the memory cell MC without the sense amplifier 27 operating.

The precharge control circuit 66a receives the low level of the column selecting signal CLZ, and turns the bit line controlling signal BRSZ2 to high level (FIG. 17(g)). Then, the bit lines BL and /BL are precharged (FIG. 17(h)).

On the other hand, the timings for a read operation in this embodiment are almost the same as those of the first embodiment described above. Here, the precharging operation to the bit lines BL and /BL in the read operation is performed in accordance with the bit line controlling signal BRSZ.

The semiconductor integrated circuit of this embodiment can also offer the same effects as those obtained from the first and second embodiments. Moreover, this embodiment, in write operations, directly writes the write data signals WDBX and WDBZ2 to the memory cell MC through the bit lines BL. and /BL without operating the sense amplifier 27. Not operating the sense amplifier 27 in write operations allows a reduction in power consumption. Besides, not operating the sense amplifier 27 in write operations prevents the retained data in the memory cell MC from being amplified on the bit lines BL and /BL. This allows quicker write operations.

In the write operations, the column selecting signal CLZ is inactivated after the inactivation of the word line signal WLZ. Therefore, the write data can be kept supplied to the memory cell while the word line signal WLZ is activated, so that the write operations can be performed with reliability.

The bit lines BL and /BL are precharged by using the inverted signal of the column selecting signal CLZ. This permits the simplification of the precharge control circuit 66a.

Figure 18:
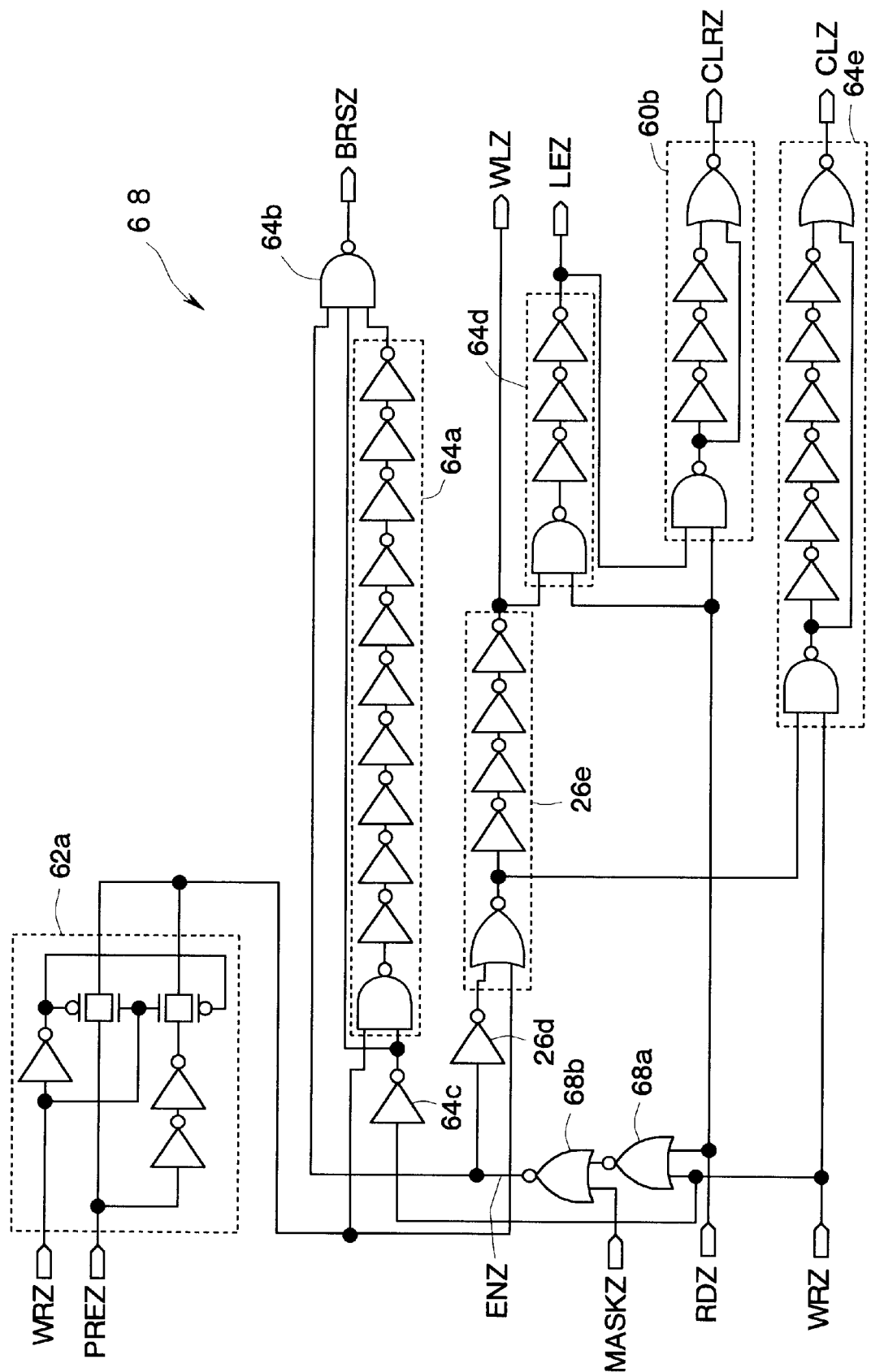
FIG. 18 is a circuit diagram showing the main parts of the timing control unit in a fourth embodiment.

FIG. 18 shows the main parts of the timing control unit 68 in a fourth embodiment of the semiconductor integrated circuit according to the present invention. The same elements as those discussed in the conventional art and those of the embodiments described above will be designated by identical reference numbers, and detailed description thereof will be omitted here.

In this embodiment, the timing control unit 68 differs from the timing control unit 60 of the first embodiment. The other configuration is the same as that of the first embodiment.

The timing control unit 68 is constituted by changing the OR circuit 26g in the timing control unit 64 of the third embodiment described above into NOR gates 68a and 68b. The other configuration is the same as that of the timing control unit 64.

The NOR gate 68a receives control signals RDZ and WRZ, and delivers its output signal to the NOR gate 68b. The NOR gate 68b receives the output signal of the NOR gate 68a and a masking signal MASKZ, and delivers its output signal to the inverter 26d and the NAND circuit 64a.

For example, this embodiment is provided with a masking command, so that a predetermined command signal is received to turn the masking signal MASKZ to high level. The NOR gate 68b receives the high level of the masking signal MASKZ, and output low level irrespective of the levels of the control signals RDZ and WRZ. This sets the bit line controlling signal BRSZ to high level, and turns the word line signal WLZ, the sense amplifier activating signal LEZ, and the column selecting signals CLRZ and CLZ to low level. That is, the memory core 42 makes no operation irrespective of the write command WCMD and the read command RCMD.

This embodiment can also offer the same effects as those obtained from the third embodiment described above.

Next, description will be given of a fifth embodiment of the semiconductor integrated circuit in the present invention.

The semiconductor integrated circuit of this embodiment is formed as a fast cycle RAM (FCRAM). The main circuit configuration of the FCRAM is the same as that in FIG. 7 described above. An FCRAM is a memory in which the signal input/output unit, control signal generating unit and a memory core operate independently of one another, and complete by themselves after the operations. Since the three blocks in the FCRAM are thus subjected to the respective pipeline processing, the operation cycles are shortened.

The FCRAM of this embodiment adopts an address non-multiplex system in order to give top priority to shortening access time. Therefore, the row address signal and the column address signal are supplied together with and simultaneously with a command input. That is, one command input determines the operating mode such as a read operation and a write operation, and then the operating mode determined is performed.

Figure 19:
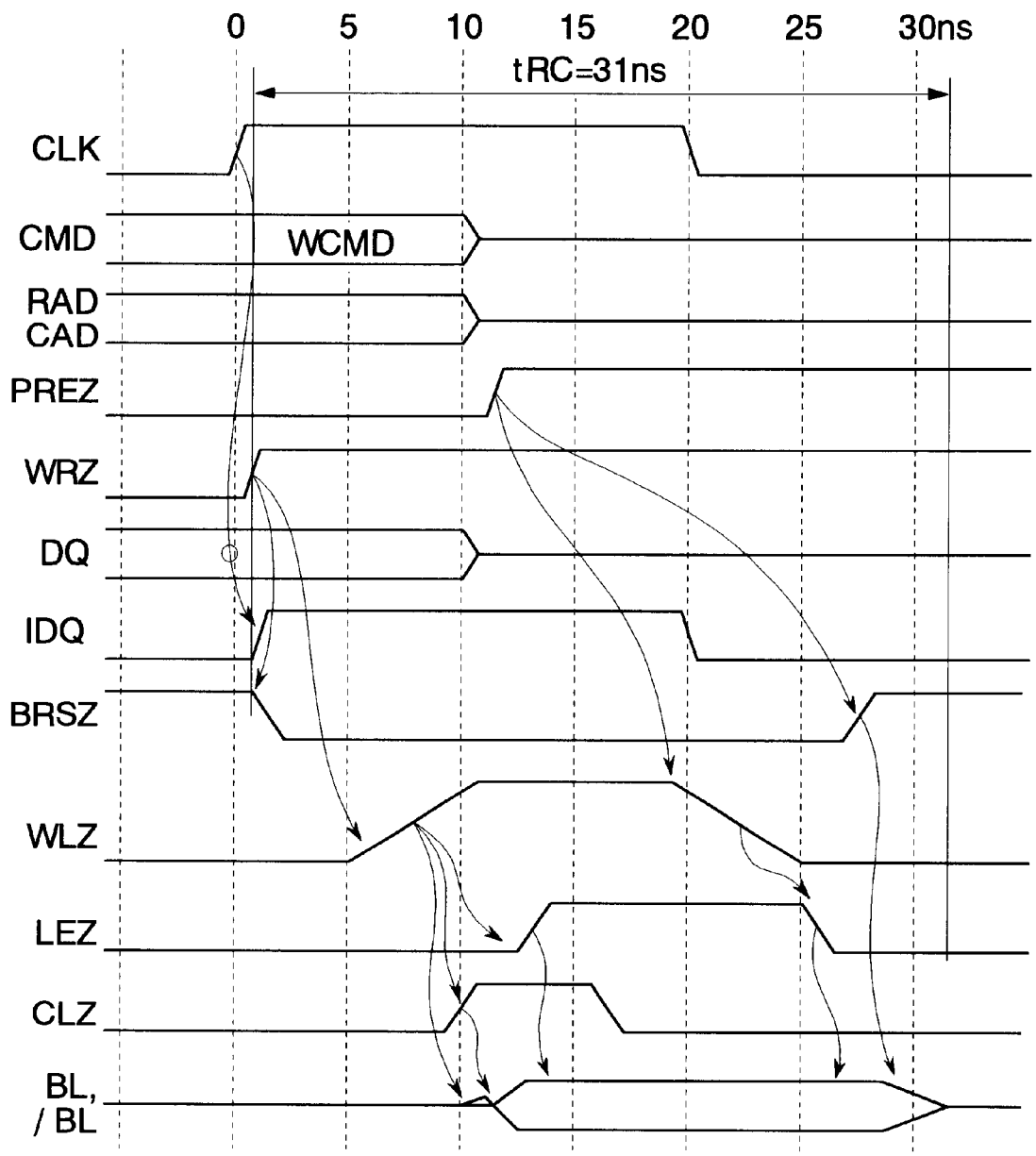
FIG. 19 is a timing chart showing a write operation in a fifth embodiment.

FIG. 19 shows the timings of the main signals for a write operation in this embodiment.

Initially, the FCRAM accepts the write command WCMD, the row address signal RAD, the column address signal CAD, and a data signal DQ in synchronization with the rise of a clock signal CLK. The reception of the write command WCMD causes the three blocks mentioned above to perform their write operation processing in sequence. Then, the signals shown in the chart are changed under the same timings as those of the waveforms in FIG. 10, to perform the write operation.

Figure 20:
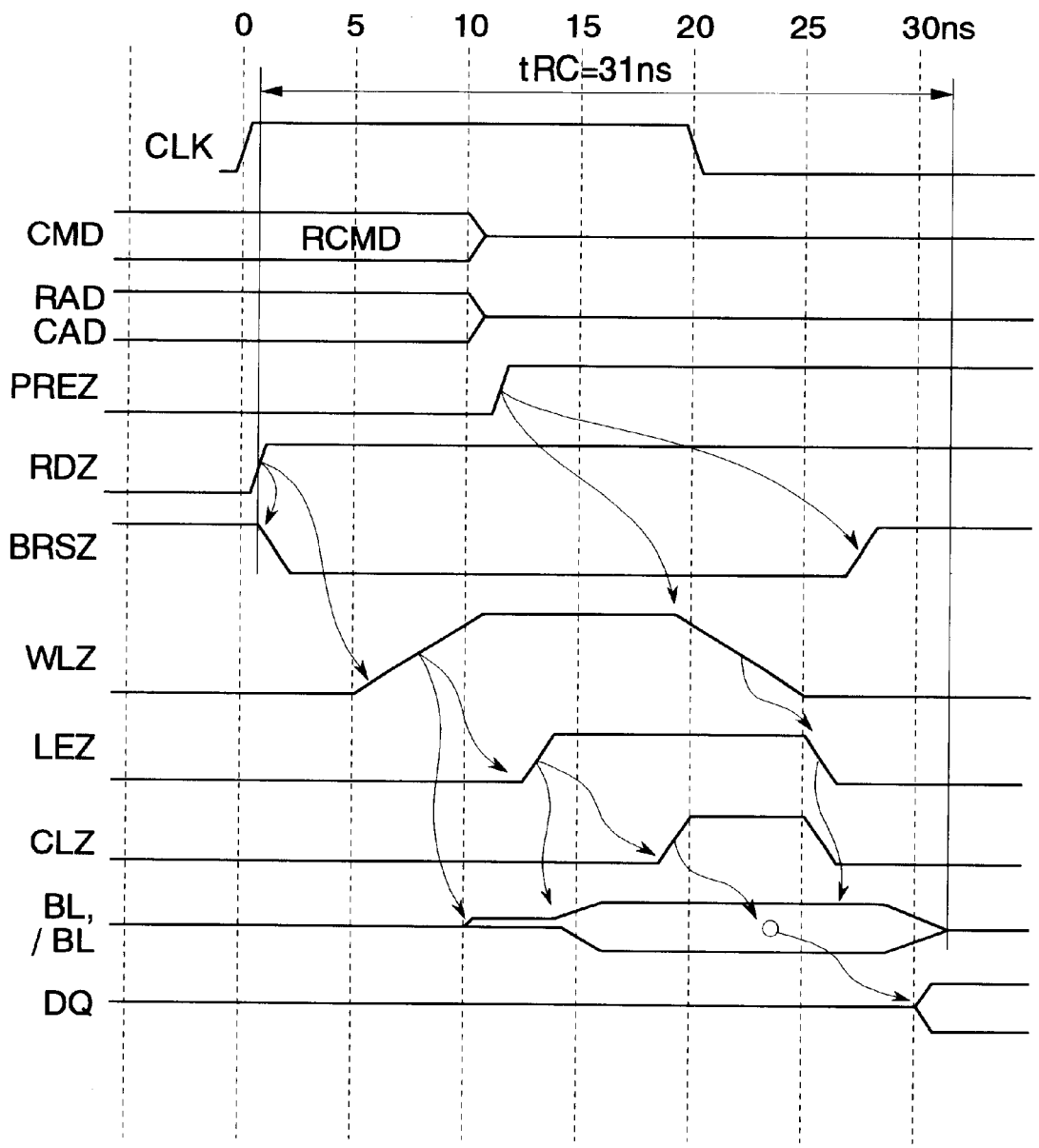
FIG. 20 is a timing chart showing a read operation in the fifth embodiment.

FIG. 20 shows the timings of the main signals for a read operation in this embodiment.

Initially, the FCRAM accepts the read command RCMD, the row address signal RAD, and the column address signal CAD in synchronization with the rise of the clock signal CLK. The reception of the read command RCMD causes the three blocks mentioned above to perform their read operation processing in sequence. Then, the signals shown in the chart are changed under the same timings as those of the waveforms in FIG. 11, to perform the read operation.

This embodiment can also offer the same effects as those obtained from the first embodiment described above. In particular, the FCRAM can determine whether the write processing or the read processing is to follow, at the instant of accepting the first command. Therefore, the activation timing of the column selecting signal CLZ can be easily changed between a write operation and a read operation. Parenthetically, in a conventional SDRAM or the like, two command inputs were needed to perform a write operation or a read operation, and the determination whether to perform a write operation or to perform a read operation was made after having waited the second command input. Therefore, it was difficult to advance the activation timing of the column selecting signal CLZ in write operations.

The second embodiment described above has dealt with the case where the precharging operation is made at different timings in a write operation and a read operation. The present invention is not limited to such an embodiment. For example, the timings of the precharging operation may be made variable. In this case, the optimum cycle times can be set in accordance with the product's capability.

The modifications to the precharging operation timings may be established by blowing implemented fuses. Here, the start timings of the precharging operation can be optimized by blowing fuses in accordance with the performance characteristics evaluated by probing tests.

The modifications to the precharging operation timings may be established in accordance with the voltage of the conductive layer that is formed on the chip in correspondence with the pattern configuration of the photomask used in the semiconductor fabrication process. In this case, the start timings of the precharging operation can be optimized in accordance with the product specifications by changing the photomask according to the product specifications.

Alternatively, the modifications to the precharge operation timings may be established in accordance with the voltage of the pads formed on the chip. In this case, the start timings of the precharging operation can be optimized by, for example, changing the destinations of the bonding wires connected with the bonding pads in the assembly process.

The embodiments described above have dealt with the cases where the present invention is applied to a DRAM. The present invention is not limited to such embodiments. For example, the present invention may be applied to a synchronous DRAM (SDRAM), an SRAM, a flash memory, and the like. The present invention may also be applied to a system LSI implementing a DRAM memory core.

The fourth embodiment described above has dealt with the case where the masking signal MASKZ is turned to high level by command input. The present invention is not limited to such an embodiment. For example, there may be provided a dedicated masking terminal so that the masking signal MASKZ is turned to high level by an external masking signal supplied through this masking terminal. Alternatively, a masking bit may be provided in the mode register (not shown) so that the masking signal MASKZ is turned to high level by writing the logic "1" to this masking bit.

Furthermore, in the case of, for example, masking both the upper side and the lower side of a data signal, all that is needed is to form the above-described masking circuit for two lines.

The invention is not limited to the above embodiments and various modifications may be made without departing from the spirit and the scope of the invention. Any improvement may be made in part or all of the components.

What is claimed is:

1. A semiconductor integrated circuit comprising:
   a memory cell including a memory element and a transfer switch for connecting the memory element with a bit line;
   a column switch for transmitting data to said bit line;
   a sense amplifier for amplifying data transmitted to said bit line; and
   a control unit for controlling said transfer switch, said column switch, and said sense amplifier, and for turning on said column switch after the turning-on of said transfer switch and before the start of the amplifying operation of said sense amplifier, in a write operation.

2. A semiconductor integrated circuit according to claim 1, further comprising a precharging circuit for charging said bit line, and wherein
   said control unit differentiates the timings activation starts in said precharging circuit, between a read operation and a write operation.

3. A semiconductor integrated circuit according to claim 2, wherein, the timing the activation starts in said precharging circuit is variable in a read operation.

4. A semiconductor integrated circuit according to claim 3, wherein said start timing is set by blowing an implemented fuse.

5. A semiconductor integrated circuit according to claim 3, wherein said start timing is set in accordance with the voltage of a conductive layer formed corresponding to the pattern configuration of a photomask used in a semiconductor fabrication process.

6. A semiconductor integrated circuit according to claim 3, wherein said start timing is set in accordance with the voltage of a pad formed on the integrated circuit.

7. A semiconductor integrated circuit comprising:
   a memory cell including a memory element and a transfer switch for connecting the memory element with a bit line;
   a column switch for transmitting data to said bit line;
   a sense amplifier for amplifying data transmitted to said bit line; and
   a control unit for controlling said transfer switch, said column switch, and said sense amplifier, and for turning on said column switch before turning on said transfer switch, in a write operation.

8. A semiconductor integrated circuit according to claim 7, wherein said control unit sets the amplification of said sense amplifier in a write operation to start before the amplification of said sense amplifier in a read operation starts.

9. A semiconductor integrated circuit comprising:
   a memory cell including a memory element and a transfer switch for connecting the memory element with a bit line;
   a column switch for transmitting data to said bit line;
   a sense amplifier for amplifying data transmitted to said bit line; and
   a control unit for controlling said transfer switch, said column switch, and said sense amplifier, and for disabling the amplifying operation of said sense amplifier in a write operation to directly write data transmitted to said bit line through said column switch to said memory cell.

10. A semiconductor integrated circuit according to claim 9, wherein said control unit, in a write operation, turns on said column switch before turning on said transfer switch.

11. A semiconductor integrated circuit according to claim 9, wherein said control unit, in a write operation, turns off said column switch after turning off said transfer switch.

12. A semiconductor integrated circuit according to claim 9, further comprising a precharging circuit for charging said bit line, and wherein
    said control unit synchronizes the activation period of said precharging circuit with the off-period of said column switch.

13. A method of controlling a column switch of a semiconductor integrated circuit in a write operation, said semiconductor integrated circuit comprising:
    a memory cell including a memory element and a transfer switch for connecting the memory element with a bit line;
    a column switch for transmitting data to said bit line;
    a sense amplifier for amplifying data transmitted to said bit line, said method comprising the step of
    turning on said column switch after the turning-on of said transfer switch and before the start of the amplifying operation of said sense amplifier in a write operation.

14. A method of controlling a column switch of a semiconductor integrated circuit in a write operation, said semiconductor integrated circuit comprising:
    a memory cell including a memory element and a transfer switch for connecting the memory element with a bit line;
    a column switch for transmitting data to said bit line; and
    a sense amplifier for amplifying data transmitted to said bit line, said method comprising the step of
    turning on said column switch before turning on said transfer switch in a write operation.

15. A method of controlling a column switch of a semiconductor integrated circuit in a write operation, said semiconductor integrated circuit comprising:
    a memory cell including a memory element and a transfer switch for connecting the memory element with a bit line;

a column switch for transmitting data to said bit line;

a sense amplifier for amplifying data transmitted to said bit line, said method comprising the step of:

disabling the amplification of said sense amplifier in a write operation; and directly writing data transmitted to said bit line through said column switch to said memory cell in said write operation.

* * * * *